United States Patent [19]

Maruyama

[11] Patent Number: 5,463,587

[45] Date of Patent: Oct. 31, 1995

[54] NONVOLATILE SEMICONDUCTOR SYSTEM

[75] Inventor: Akira Maruyama, Suwa, Japan

[73] Assignee: Seiko Epson Corporation, Tokyo, Japan

[21] Appl. No.: 390,286

[22] Filed: Feb. 15, 1995

Related U.S. Application Data

[63] Continuation of Ser. No. 150,054, filed as PCT/JP93/00363, Mar. 25, 1993, abandoned.

[30] Foreign Application Priority Data

Mar. 25, 1992 [JP] Japan ................................... 4-067013

[51] Int. Cl.$^6$ .............................. G11C 7/02; G11C 16/06
[52] U.S. Cl. .................... 365/210; 365/184; 365/185.24; 365/185.26
[58] Field of Search .................... 365/185, 210, 365/218, 104, 184, 201

[56] References Cited

U.S. PATENT DOCUMENTS 4,956,816  9/1990  Atsumi et al. ...................... 365/210 X
5,142,496  8/1992  Van Buskirk ........................ 365/185 X

FOREIGN PATENT DOCUMENTS 1-103096 U  7/1989  Japan .
4-3395      1/1992  Japan .

*Primary Examiner*—Joseph A. Popek
*Attorney, Agent, or Firm*—Oliff & Berridge

[57] ABSTRACT

It is an object of the present invention to optimize the range of threshold voltage in a flash EEPROM and to simplify the verifying operation. In memory transistors (1)–(4) and a dummy memory transistor (5), erasing operation can be performed by setting a source lines SL and a dummy source line DSL at Vpp-level and Vpp1-level, respectively and by setting word lines WL1, WL2 and a dummy word line DWL at GND level. As the erasing process proceeds, the threshold voltage in the dummy memory transistor (5) is reduced before the threshold voltages in the memory transistors (1)–(4) are reduced. Therefore, the verifying operation can be executed by only detecting the threshold voltage in the dummy memory transistor. In addition, the overerasing can be prevented by previously detecting the threshold voltage in the dummy memory transistor.

22 Claims, 19 Drawing Sheets

NONVOLATILE SEMICONDUCTOR SYSTEM

This is a Continuation of application Ser. No. 08/150,054 filed as PCT/JP93/00363, Mar. 25, 1993, now abandoned.

BACKGROUND OF THE INVENTION

1. Field of the Invention

The present invention relates to a nonvolatile semiconductor system and particularly to a method of erasing a flash (entire array erasure type) EEPROM.

2. Technical Background

FIG. 18 shows a circuit diagram of a flash EEPROM constructed in accordance with the prior art. For simplicity, the flash EEPROM is assumed to be a four-memory-transistor structure. It comprises four memory transistors 1–4, an N-channel transistor 6, a P-channel transistor 7, an X-decoder circuit 110, a write/erase control circuit 111, an interface circuit 12 and an inverter circuit 18. The flash EEPROM also comprises an address buffer 92, a Y-decoder circuit 94, a sense amplifier 96 and a data buffer 98. The EEPROM further comprises bit lines BL1, BL2, word lines WL1, WL2 and a source line SL.

The interface circuit 12 functions to convert a fluctuation of input voltage at Vdd-GND into a fluctuation of output voltage at Vpp-GND.

Address signal is inputted into the X- and Y-decoders 110, 94 through the address buffer 92. Thus, the X-decoder 110 generates X-decode signals for the memory transistors and wordline signals to the word lines WL1 and WL2. On the other hand, the Y-decoder 94 generates Y-decode signals which are in turn supplied to the write/erase control circuit 111 and sense amplifier 96.

The write/erase control circuit 111 is responsive to the Y-decode signal to control the writing of data. More particularly, the write/erase control circuit 111 writes data signals inputted thereinto through the data buffer 98 into the memory transistors 1–4 using the Y-decode signals as addresses. The write/erase control circuit 111 can also erase the data stored in the memory transistor 1–4.

The sense amplifier 96 reads out the data stored in the memory transistors 1–4 using the Y-decode signals as addresses. The read data are then outputted, as data signals, from the sense amplifier 96 to any external unit through the data buffer 98.

The operation of such a prior art system will now be described with reference to FIG. 19 which illustrates the voltages at various different components.

As shown in FIG. 19, the writing to the memory transistor 1 is carried out when WL1 and BL1 are respectively in high-voltage Vpp level and WL2 and BL2 are respectively in GND level. When the erase signal is made L level (lower logical invert level), the N-channel transistor 6 is turned on and the P-channel transistor 7 is turned off. Thus, the source line SL becomes GND level to cause the memory transistor 1 to generate a channel current and also to generate hot electrons at the drain region edge thereof. The electrons are then injected into a floating gate electrode which in turn performs the writing operation. In this case, writing operation will not be made in the other memory transistors 2–4 since no channel current is generated therein.

When the erasing operation is to be performed, as shown in FIG. 19, WL1 and WL2 are made GND level while BL1 and BL2 are made open level. Further, the erase signal is shifted to H level (upper logical invert level) so that the N-channel and P-channel transistors 6, 7 will be turned off and on, respectively. Thus, the source line SL becomes Vpp level so that tunnel current will be generated between the floating gate electrodes and the source region. Electrons are then released from the floating gate electrodes to the source region for erasing.

In the prior art, it is a highly technical problem that on the writing or erasing operation, the threshold voltage in a memory transistor can be limited within a proper range. For example, if the erasure is too much made, the release of electrons is too much increased so that the threshold voltage in the memory transistor will be shifted to negative level. Even if only one memory transistor becomes such an overerasing depletion type, leak current will flow into a bit line connected to that memory transistor. As a result, it is impossible to read the memory transistor connected to this bit line. On the other hand, if the erasure is insufficient, there may be created any memory transistor which will not be reversed even at the set logical invert level.

Such a problem may be overcome by the use of a measure called "verifying operation". In the verifying operation, it is always monitored whether or not a memory transistor in question has sufficiently been erased. If it is judged that the memory transistor has sufficiently been erased, the erasure against that memory transistor will be terminated. If the memory transistor has not sufficiently been erased, the erasing operation against the memory transistor will be continued. However, the verifying operation increases the scale of the circuit and becomes the control complicated.

In order to overcome such problems, it is an object of the present invention to optimize the range of threshold voltage and to simplify the verifying operation.

SUMMARY OF THE INVENTION

The present invention provides a nonvolatile semiconductor system having a memory transistor comprising a floating gate electrode, a control gate electrode and first and second diffusion layers, said memory transistor capable of storing data by injecting electrons into and releasing electrons from said floating gate electrode, the improvement comprising at least one dummy memory transistor having a set speed of threshold voltage change different from that of said memory transistor, means for causing electrons to be injected into or released from said dummy memory transistor, and means for detecting the threshold voltage at said dummy memory transistor when the electrons are injected into or released from said floating gate electrode.

The present invention provides at least one dummy memory transistor having a set speed of threshold voltage change different from that of the memory transistor on injection/release of electrons. As a result of this, only the threshold voltage at the dummy memory transistor is required to be checked on the injection/release of electrons. That is, the threshold voltages in a huge number of memory transistors are not required to be checked. Since the dummy memory transistor having a set speed of threshold voltage change different from that of the memory transistor, the overerasing in the memory transistor can be not only prevented but also the other different adjustments such as optimization of the logical invert level in the memory transistor, prevention of over-writing and so on can be performed. This more highly optimizes the threshold voltage. The term "speed of threshold voltage change" used herein means an amount of threshold voltage change in the memory transistor or dummy memory transistor through time during which the injection/release of electrons are being performed.

The dummy memory transistor may comprises a first dummy memory transistor having a set speed of threshold voltage change higher than that of said memory transistor and a second dummy memory transistor having another set speed of threshold voltage change lower than that of said memory transistor. On the injection/release of electrons, the threshold voltage in said memory transistor can be set within a proper range by these first and second dummy memory transistors.

Thus, the lower limit of the threshold voltage as well as the upper limit thereof can be checked. Therefore, the logical invert level can be optimized while preventing the overerasing.

The speed of threshold voltage change in the dummy memory transistor can be set by changing a voltage to be applied to either of the first or second diffusion layer in said dummy memory transistor.

Where the speed of threshold voltage change is set by changing the voltage to be applied in such a manner, a plurality of dummy memory transistors having different speeds of threshold voltage change may be provided without modifying the process or the like. Therefore, the higher adjustment of threshold voltage can be made more simply.

The speed of threshold voltage change in the dummy memory transistor can also be set by changing time at which the application of a voltage to either of the first or second diffusion layer in said dummy memory transistor is initiated.

Similarly, this can permit the simpler and higher adjustment of threshold voltage without changing the process and the like.

The speed of threshold voltage change in the dummy memory transistor may also be set by changing the initial threshold voltage in the dummy memory transistor. Furthermore, the speed of threshold voltage change in the dummy memory transistor may be set by changing the capacitance of the floating and control gate electrodes in said dummy memory transistor. Thus, a plurality of dummy memory transistors having different speeds of threshold voltage change can be provided.

The means for detecting the threshold voltage in said dummy memory transistor may be one that detects the threshold voltage by applying a voltage to either of the first or second diffusion layer in said dummy memory transistor.

This realizes a threshold voltage detecting means having very simplified structure. Further, such a threshold voltage detecting means is very improved in speed and sensitivity.

The means for detecting the threshold voltage in said dummy memory transistor may be one that detects said threshold voltage by detecting a voltage at either of said first or second diffusion layer in said dummy memory transistor or by detecting an electric current flowing between said first and second diffusion layers in said dummy memory transistor. Thus, the threshold voltage detecting means may be realized to provide a stable measurement without being affected by process fluctuation.

The present invention also provides a nonvolatile semiconductor system having a memory transistor comprising a floating gate electrode, a control gate electrode and first and second diffusion layers, said memory transistor capable of storing data by injecting electrons into and releasing electrons from said floating gate electrode, the improvement comprising at least one dummy memory transistor having a speed of threshold voltage change different from that of said memory transistor, means for causing the electrons to be injected into or released from said dummy memory transistor, and means for detecting the threshold voltage in said dummy memory transistor in a verifying operation for monitoring the threshold voltage after the electrons have been injected into or released from said memory transistor.

In the present invention, only the threshold voltage in the dummy memory transistor is required to be checked on the verifying operation, that is, threshold voltages in a huge number of memory transistors are not required to be checked. In addition to the checking of any overerasing in the memory transistor, the logical invert level, over-writing and others may be checked.

In this case, the number and form of dummy memory transistors, the setting in the speed of threshold voltage change and the threshold voltage detecting means may be selected as in the aforementioned arrangement. Thus, the verifying operation providing the higher adjustment of threshold voltage can be realized without need for any complicated circuit. Time required to perform the writing erasing and verifying operations can be reduced.

DETAILED DESCRIPTION OF PREFERRED EMBODIMENTS

The first to fourth embodiments of the present invention are intended to optimize the threshold voltage range in a memory transistor on the erasing and writing operations.

(1) First Embodiment

Figure 1:
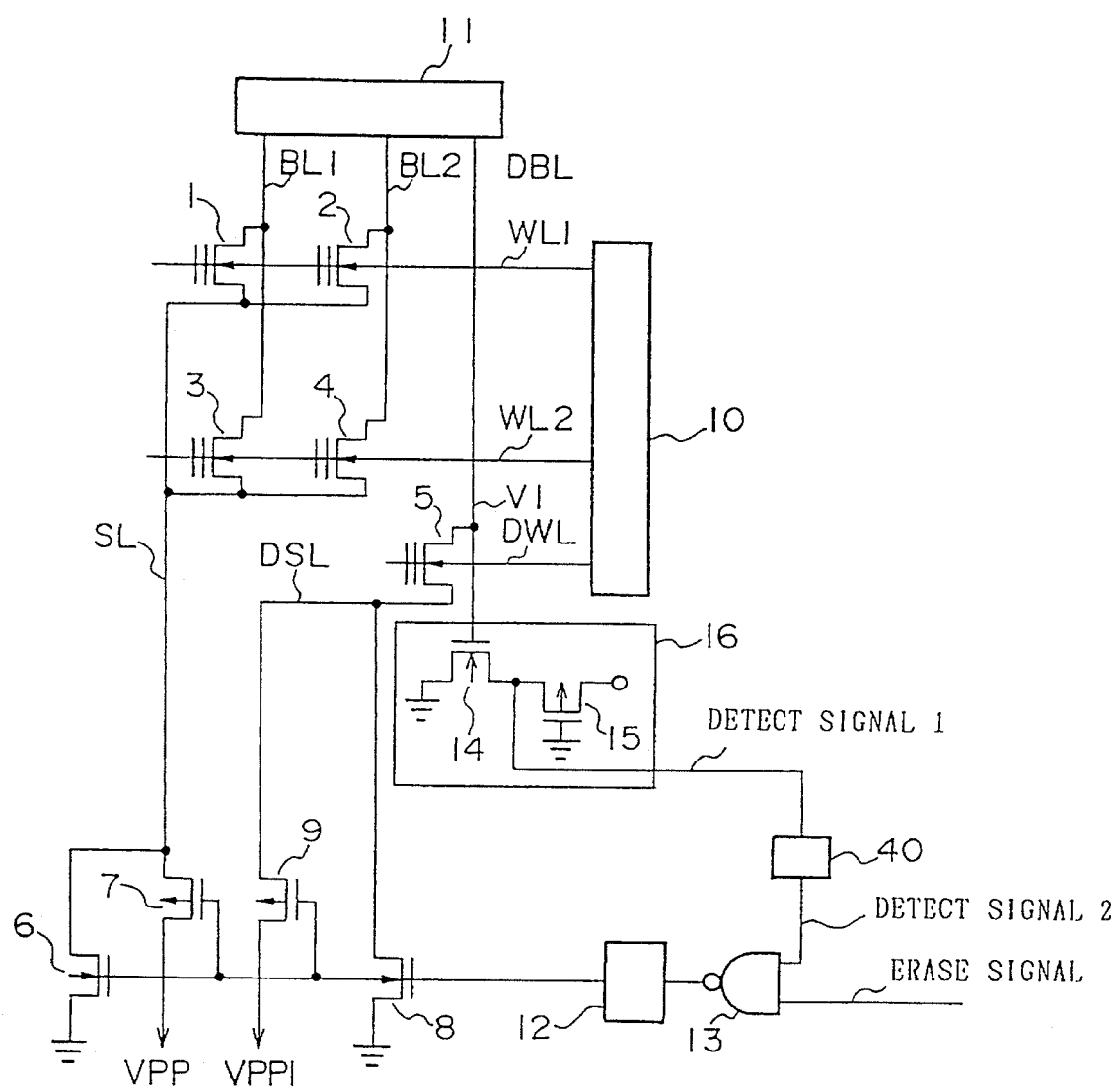
FIG. 1 is a circuit diagram of the first embodiment of a nonvolatile semiconductor system constructed in accordance with the present invention.

FIG. 1 shows a circuit diagram of the first embodiment of a nonvolatile semiconductor system constructed in accordance with the present invention.

For simplicity, it is now assumed that the nonvolatile semiconductor system comprises four memory transistors. Indeed, however, the memory part of the first embodiment is formed of a matrix array having the desired number of memory transistors. The nonvolatile semiconductor system comprises four memory transistors 1–4, a dummy memory transistor 5 having the same structure as in the memory transistors 1–4, N-channel transistors 6 and 8, P-channel transistors 7 and 9, an X-decoder circuit 10, a write/erase control circuit 11, an interface circuit 12, a NAND circuit 13, a voltage detecting circuit 16 consisting of a N-channel transistor 14 and a P-channel transistor 15, and a latch circuit 40 for latching a detect signal 1 from the voltage detecting circuit 16 to output it as a detect signal 2, such as RS latch circuit.

The interface circuit 12 functions to convert a fluctuation of input voltage at Vdd-GND into a fluctuation of output voltage at Vpp-GND. Bit lines BL1 and BL2 are connected to the respective drain regions of the memory transistors 1–4. Word lines WL1 and WL2 are connected to the respective control gate electrodes of the memory transistors 1–4. Further, a source line SL is connected to the respective source regions of the memory transistors 1–4. In addition, dummy bit line DBL, dummy word line DWL and dummy source line DSL are respectively connected to the drain region, control gate electrode and source region of the dummy memory transistor 5.

The circuit of the present embodiment utilizes the X-decoder and write/erase control circuits 10, 11 to write and read data relative to the matrix memory transistor array. The circuit of the present embodiment also performs the erasure relative to the matrix memory transistor array by applying a high voltage thereto through the P-channel transistor 7.

In addition to the parts of the prior art system, thus, the first embodiment newly comprises the dummy memory transistor 5, the P-channel and N-channel transistors 9 and 8 which define a control circuit for the dummy memory transistor 5, the voltage detecting circuit 16 and the latch and NAND circuits 40, 13 which are operatively associated with the voltage detecting circuit 16. Unlike the prior art system, the X-decoder and write/erase control circuits 10, 11 function to control the writing, erasing and reading relative to the memory transistor as well as the dummy memory transistor. The voltage detecting circuit 16 is one that detects the voltage at the dummy bit line DBL to sense the threshold voltage in the dummy memory transistor 5. As will be described, the speed of threshold voltage change in the dummy memory transistor 5 is set to be different from those in the memory transistors 1–4. As a result, the threshold voltages in the memory transistors 1–4 can be set within a proper range by detecting the threshold voltage in the dummy memory transistor 5 through the voltage detecting circuit 16.

The operation of the first embodiment will now be described in detail with reference to FIG. 2.

Figure 2:
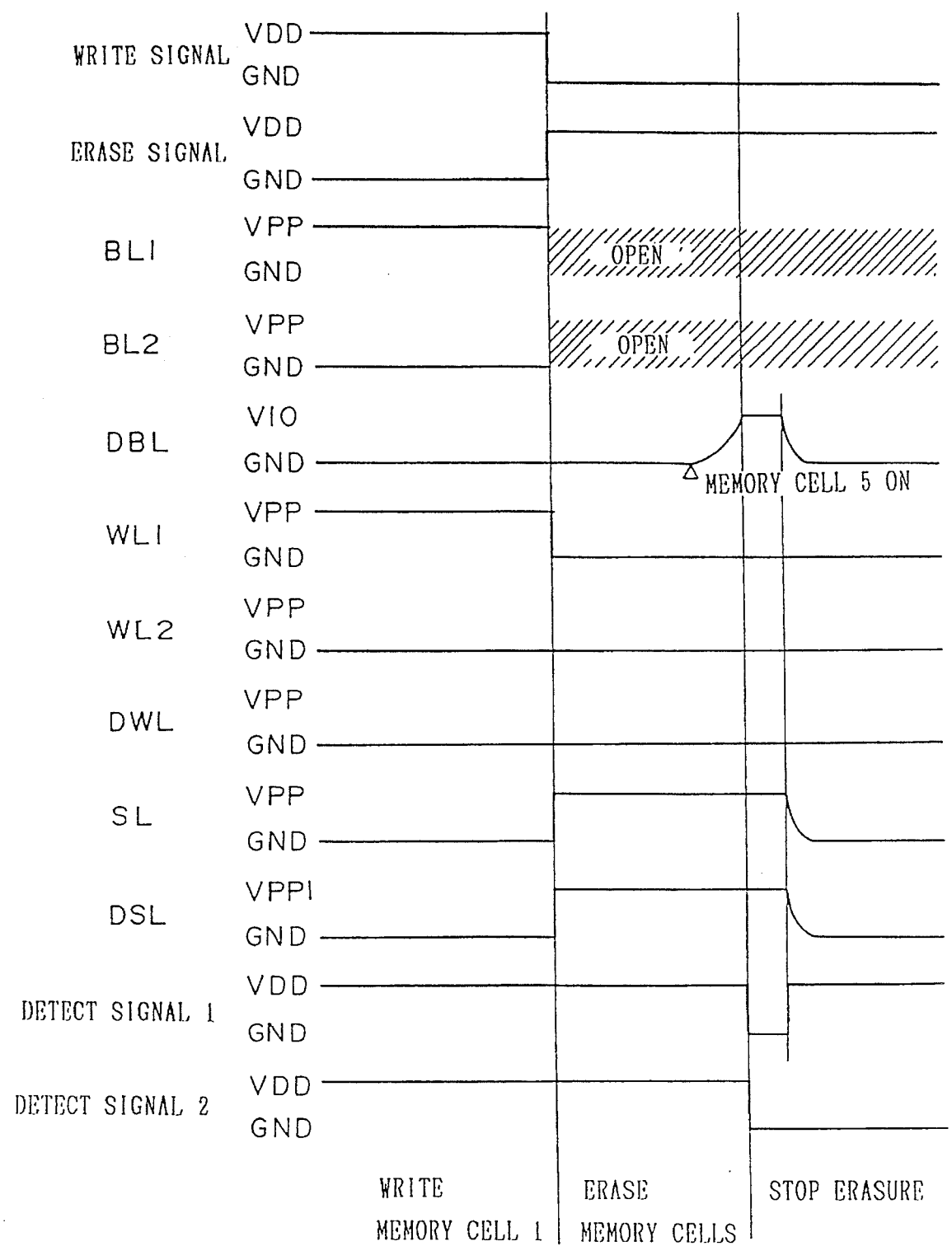
FIG. 2 is a view illustrating voltages in the first embodiment at various parts to explain the operation thereof.

The writing process will first be described. As shown in FIG. 2, the transistors 6 and 8 are turned on and the transistors 7 and 9 are turned off by making the erasure signal L-level for the writing operation. When it is wanted to write data in the memory transistor 1 under the above condition, the setting will be made as follows:

As shown in FIG. 2, the write/erase control circuit 11 sets the bit line BL1 at Vpp-level and the bit lines BL2 and DBL at GND-level. Further, the X-decoder circuit 10 sets the word line WL1 at Vpp-level and the word lines WL2 and DWL at GND-level. Under such a setting, the voltages at the control gate electrode and drain region in only the memory transistor 1 are made Vpp-level simultaneously. As a result, a channel current will be produced only in the memory transistor 1 which in turn generates hot electrons at the drain region edge thereof so that electrons will be injected into the floating gate electrode. Thus, the writing process will be executed only relative to the memory transistor 1. On the other hand, the writing process will not be executed relative to the other memory transistors 2–4 and the dummy memory transistor 5 since the floating gate electrode and drain region thereof are not simultaneously made Vpp-level to produce the channel current. It is noted that the writing process may be executed relative to the dummy memory transistor 5 in the same manner as described.

The erasing operation will be described. Prior to the erasing operation, the aforementioned writing operation has previously been executed relative to the memory transistors 1–4 and dummy memory transistor 5. As shown in FIG. 2, the erase signal is then made H-level. The bit lines BL1 and BL2 are set at such a state that no voltage is applied thereto through the write/erase control circuit 11. The dummy bit line DBL is set at GND-level by pulling down it through a transistor in the write/erase control circuit 11 that has very low power-supply-ability. Under such a condition, the detect signal 1 at the voltage detecting circuit 16 is pulled up to High-level by the P-channel transistor 15 and then latched by the latch circuit 40 before the detect signal 1 is outputted therefrom as a detect signal 2 of H-level. As a result, the P-channel transistors 7 and 9 are turned on and the N-channel transistors 6 and 8 are turned off. Under such a situation, the word lines WL1, WL2 and DWL are set to be at GND-level by the X-decoder circuit 10, as shown in FIG. 2. Thus, the voltages in the control gate electrodes of the memory transistors 1–4 and dummy memory transistor 5 are set at GND-level and the voltages SL and DSL of the source regions thereof are set at Vpp-level and Vpp1-level, respectively. This results in creation of a tunnel current between the floating gate electrode and source region. As a result, electrons are released from the floating gate electrode into the source region to perform the erasing operation.

The latch circuit 40 may be in the form of an RS latch circuit which is reset to output a detect signal 2 of L-level when the detect signal 1 becomes L-level and which is set to output a detect signal 2 of H-level on the writing operation.

The first embodiment is set such that the supply voltage Vpp1 of the dummy memory transistor 5 is higher than the supply voltage Vpp of the memory transistors 1–4. Thus, the speed of threshold voltage change in the dummy memory transistor 5 will be higher than those of the memory transistors 1–4. The speed of threshold voltage change is an amount of change in the threshold voltage of a memory transistor or dummy memory transistor relative to time through which the injection/release of electrons have been performed. As the erasing process proceeds to reduce the threshold voltage to a sufficiently low level, the amount of change in the threshold voltage of the dummy memory transistor will be increased. Therefore, the dummy memory transistor 5 will be turned on before the memory transistors 1–4 are turned on. As a result, the voltage V1 in the dummy bit line DBL is pulled up toward the Vpp1 level through the P-channel transistor 9 to increase the voltage V1, as shown in FIG. 2. In such a case, the power-supply-ability of the N-channel transistor 14 is set to be sufficiently higher than that of the P-channel transistor 15. When the voltage V1 becomes equal to a set voltage V10, therefore, the detect signal 1 of the voltage detecting circuit 16 is switched to L-level and latched by the latch circuit 40 before the detect signal 2 is outputted, as shown in FIG. 2. As a result, the P-channel transistors 7 and 9 are turned off and the N-channel transistors 6 and 8 are turned on. The voltage in the source line SL becomes GND-level, as shown in FIG. 2. Consequently, the erasing operation will terminate.

It is now assumed that the set voltage V10 is set to be equal to 0.8 V when the detect signal 1 of the voltage detecting circuit becomes L-level. More particularly, such a setting can be provided when the threshold voltage of the N-channel transistor 14 is equal to about 0.8 V. This is because the power-supply-ability of the N-channel transistor 14 is set to be sufficiently higher than that of the P-channel transistor 15, as described. The threshold voltage DVth of the dummy memory transistor 5 when the detect signal 1 becomes L-level is calculated in the following manner. Since the voltage V10 is set to be 0.8 V, the body effect is created in the threshold voltage of the dummy memory transistor 5. The threshold voltage DVth of the dummy memory transistor 5 increases by about 0.2 V. As described, the dummy word line DWL has been set at GND-level. The voltage V1 in the dummy bit line DBL has been set to be V10=0.8 V when the detect signal 1 became L-level. Thus, the threshold voltage in the dummy memory transistor will be calculated to be DVth=−0.8 V−0.2 V=−1.0 V when the detect signal 1 becomes L-level.

In such a case, therefore, the speeds of threshold voltage change in the dummy memory transistor and memory transistors 1–4 is set such that when the threshold voltage in the dummy memory transistor 5 becomes to be equal to −1.0 V, the threshold voltages in the memory transistors 1–4 become equal to or higher than 0 V. More particularly, such a setting may be made by setting the supply voltage Vpp1 applied to the dummy memory transistor 5 to be higher than the supply voltage Vpp applied to the memory transistors 1–4. Thus, the threshold voltages in the memory transistors 1–4 become negative. Namely, the overerasing will be avoided.

As described, the first embodiment sets the speed of threshold voltage change in the dummy memory transistor 5 by changing the supply voltage Vpp1. This is very advantageous with respect to the process, compared with the case in which the speed of threshold voltage change would be changed as by changing the capacitance between the control gate electrode and the floating gate electrode or by changing the thickness in the tunnel oxide film in the memory cell.

Thus, the first embodiment permits the dummy memory transistor 5 to be of the same structure as in the memory transistors 1– 4. When it is wanted to set the memory transistors 1–4 such that their speeds of threshold voltage change will be different from that of the dummy memory transistor 5, it can be performed without the process being changed such as change of the thickness in the tunnel oxide film of the memory cell or change of the capacitance between the control gate electrode and the floating gate electrode. As a result, at least one step can be omitted from the process to improve in reliability and yield. Particularly, the matching can be improved to provide an overerasure preventing circuit with its increased accuracy since the memory transistors 1–4 can be of the same structure as in the dummy memory transistor 5.

Typically, such a kind of memory transistor has two different power sources for writing and erasing. Therefore, divided resistor, divider or the like may be used to provide such different supply voltage Vpp and Vpp1 in an easy manner. In this connection, the first embodiment is very advantageous.

Although the speed of threshold voltage change is set by changing the supply voltage Vpp1 in the first embodiment, this can also be performed by changing time at which the supply voltage begins to be applied. On the erasing operation, for example, time at which the supply voltage Vpp1 begins to be applied to the dummy memory transistor 5 may be set to be earlier than time at which the supply voltage Vpp begins to be applied to the memory transistors 1–4. Thus, the speed of threshold voltage change in the dummy memory transistor 5 can be higher than those in the memory transistors 1–4. Therefore, the dummy memory transistor 5 may be of the same structure as in the memory transistors 1–4, with respect to the process. This is very advantageous in that the dummy memory transistor 5 can be formed without introduction of any new process.

In the first embodiment, the voltage detecting circuit 16 utilizes the threshold voltage in the N-channel transistor 14 to detect the threshold voltage in the dummy memory transistor 5 which is the same N-type component as in the N-channel transistor 14. Therefore, matching can be maintained in process conditions and so on. For example, as the threshold voltage in the dummy memory transistor 5 increases, the threshold voltage in the N-channel transistor also increases. As a result, an overerasure preventing circuit with an improved accuracy, which less depends on process fluctuation can be provided.

Although the first embodiment has been described as to the detect signal 2 being used directly as a source voltage control signal, it is appreciated that it can similarly be used as a monitoring signal used to prevent the overerasing. For example, the detect signal 2 may be inputted into a microcomputer (not shown) for controlling the entire memory circuit, the microcomputer in turn monitoring and controlling the detect signal 2. If there is any overerasing, the microcomputer outputs a stop signal to stop the overerasing. If the overerasing is frequently raised up since the life of such a circuit arrangement expires, the microcomputer can know the expiration of the life and alert it to the user.

(2) Second Embodiment

Figure 3:
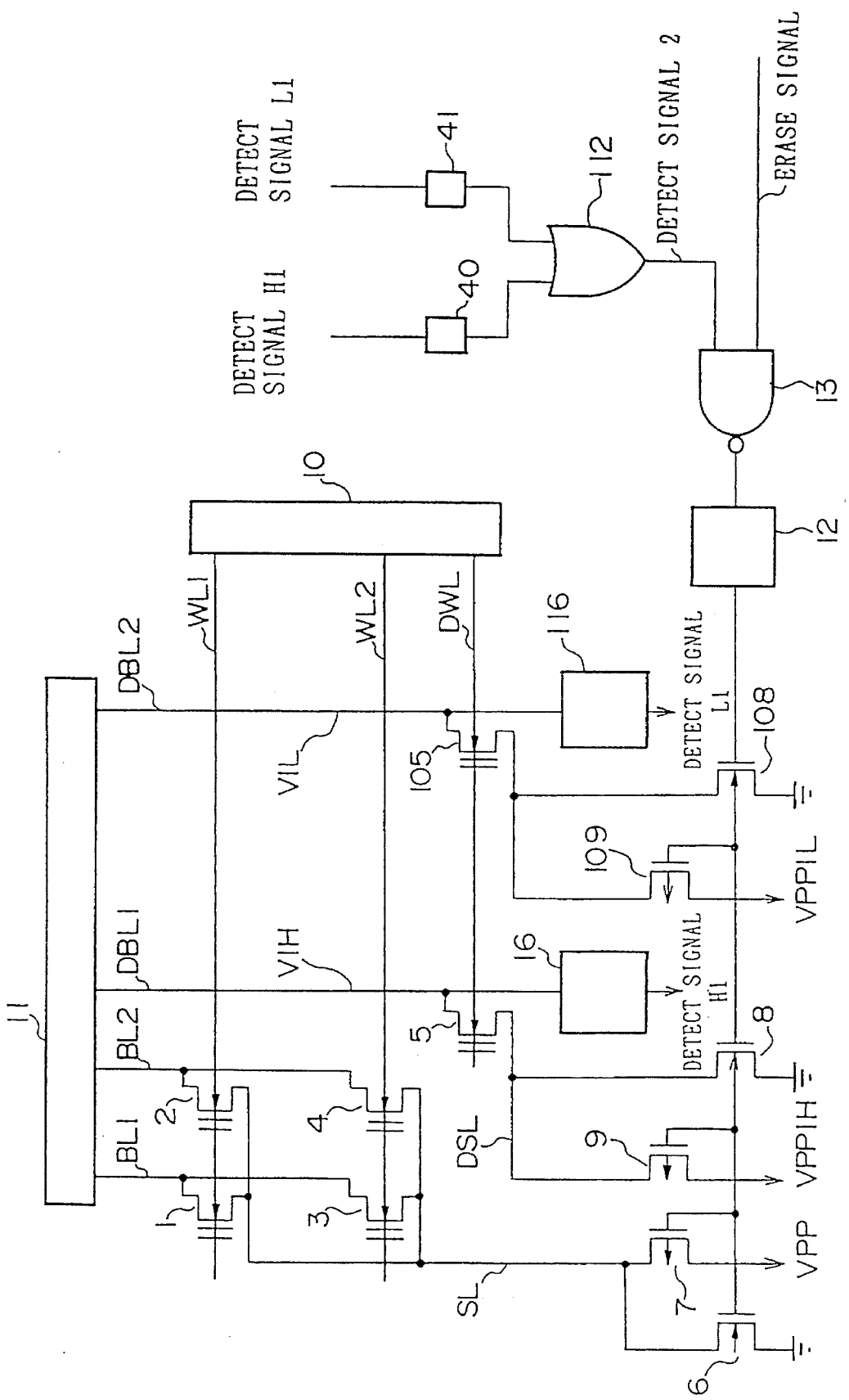
FIG. 3 is a circuit diagram of the second embodiment of a nonvolatile semiconductor system constructed in accordance with the present invention.

FIG. 3 shows a circuit diagram of the second embodiment of a nonvolatile semiconductor system constructed in accordance with the present invention, in which parts similar to those of FIG. 1 are designated by similar reference numerals.

The nonvolatile semiconductor system of the second embodiment comprises a dummy memory transistor 105, an N-channel transistor 108, a P-channel transistor 109, an OR circuit 112, a voltage detecting circuit 116 and a latch circuit 41.

The second embodiment is defined by adding the dummy memory transistor 105 and its associated control circuit as well as the voltage detecting circuit 116 and its associated circuit to the first embodiment. The drain voltage of the dummy memory transistor 105 is inputted into the voltage detecting circuit 116 to detect the threshold voltage in the dummy memory transistor 105 which in turn outputs a detect signal L1 to the OR circuit 112 through the latch circuit 41. On the other hand, another detect signal H1 outputted from the voltage detecting circuit 16 is similarly supplied to the OR circuit 112 through the latch circuit 40. The output signal of the OR circuit 112 is supplied to a NAND circuit 13.

In the second embodiment, the speed of threshold voltage change in the dummy memory transistor 5 is set to be different from that of the dummy memory transistor 105. More particularly, the speed of threshold voltage change in the dummy memory transistor 5 is set to be higher than those of all the memory transistors 1–4 while the speed of threshold voltage change in the dummy memory transistor 105 is set to be lower than those of all the memory transistors 1–4. Such settings may be performed by setting supply voltages Vpp, Vpp1H and Vpp1L such that they are different from one another (Vpp1L<Vpp<Vpp1H), respectively.

Figure 5:
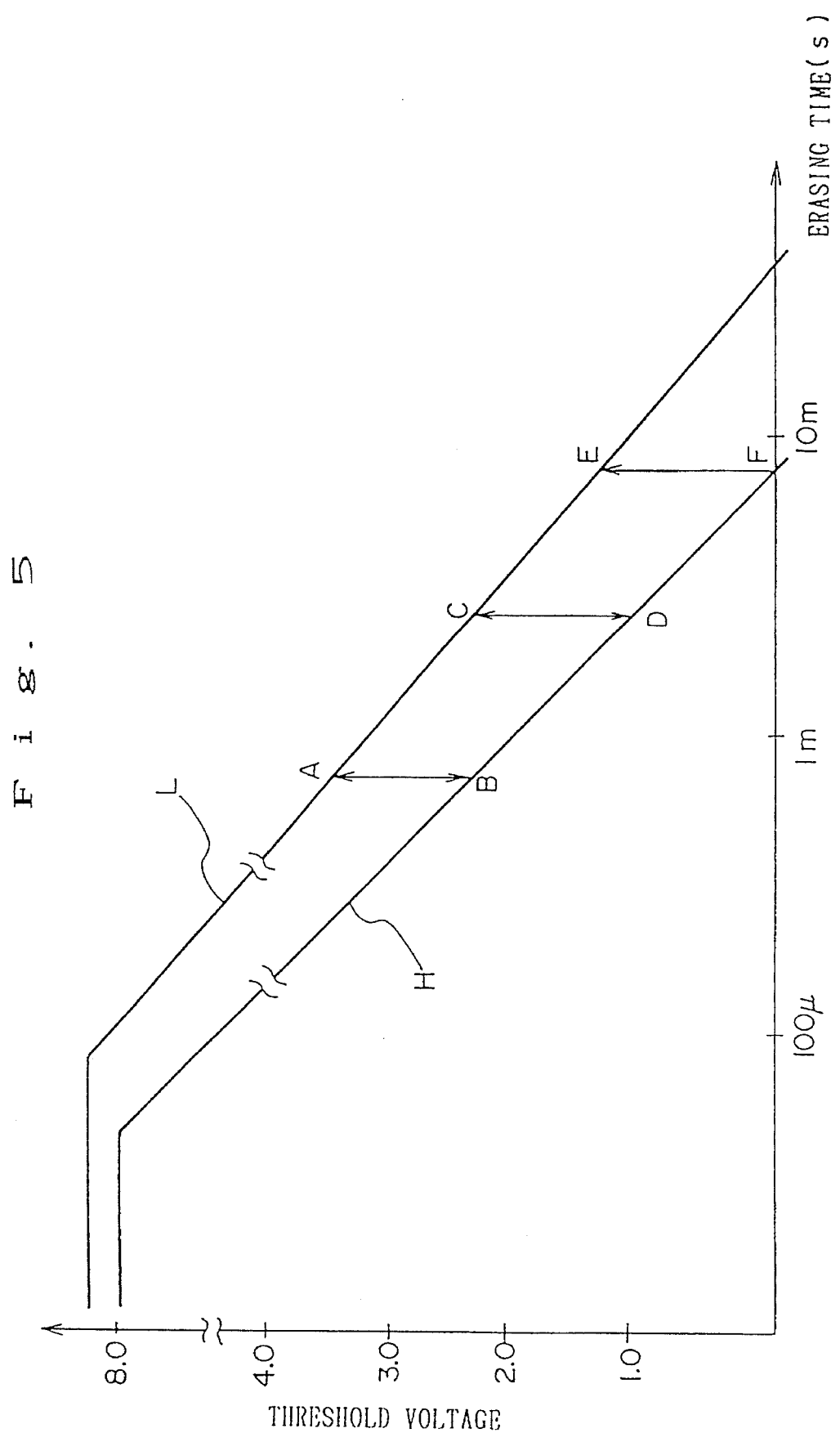
FIG. 5 is a graph illustrating the erasure characteristic of the threshold voltage in the dummy memory transistor of the second embodiment.

FIG. 5 shows variations in erasing time relative to the threshold voltages in the dummy memory transistors 5 and 105. In this figure, a curve H shows the characteristic of erasing in the dummy memory transistor 5 while another curve L shows the characteristic of erasing in the dummy memory transistor 105. It is understood from FIG. 5 that the speed of threshold voltage change in the dummy memory transistor 5 (curve H) becomes higher than that in the dummy memory transistor 105 (curve L). It is thus ensured that the characteristic curves of the memory transistors 1–4 with respect to their threshold voltages are set between the characteristic curves L and H. In other words, the speeds of threshold voltage change in the memory transistors 1–4 are set between the speeds of threshold voltage change in the dummy memory transistors 5 and 105.

The erasing process will be described. The voltage detecting circuit 16 is constructed such that when the threshold voltage in the dummy memory transistor 5 is equal to or lower than 1.0 V, the detect signal H1 becomes L-level. The voltage detecting circuit 116 is constructed such that when the threshold voltage in the dummy memory transistor 105 is equal to or lower than 3.5 V, the detect signal L1 becomes L-level. As the erasing process proceeds, the detect signal 2 becomes L-level when the threshold voltage of the dummy memory transistor 105 is equal to or lower than 3.5 V and the threshold voltage of the dummy memory transistor 5 is equal to or lower than 1.0 V. As a result, the P-channel transistors 7, 9 and 109 are turned off and the N-channel transistors 6, 8 and 108 are turned on. The voltage in the source line SL becomes GND-level to stop the erasing process.

The threshold voltages to be detected can also be set by changing voltages to be applied to the control gate electrodes of the dummy memory transistors 5 and 105. For example, a constant voltage of 1.0 V may be applied to the control gate electrode of the dummy memory transistor 5 while another constant voltage of 3.5 may be applied to the control gate electrode of the dummy memory transistor 105.

In this second embodiment, the erasing process will be terminated when the difference of threshold voltage between the dummy memory transistors is shifted from AB to CD in FIG. 5. In this case, even if the range between the characteristic curves L and H is increased due to process fluctuation, a point (D in FIG. 5) at which the detect signal H1 is outputted is set to be equal to 1.0 V such that the threshold voltages in the memory transistors 1–4 will not be equal to or lower than zero, that is, any overerasing will not be created. It is thus ensured that the threshold voltages in the memory transistors 1–4 will be placed between 3.5 V and 0 V. As a result, the overerasing can be prevented while at the same time the logical invert level in the memory transistors 1–4 can positively be set to be equal to or lower than 3.5 V or the upper limit. This improves the reliability, yield and the like in the nonvolatile semiconductor system.

Figure 4:
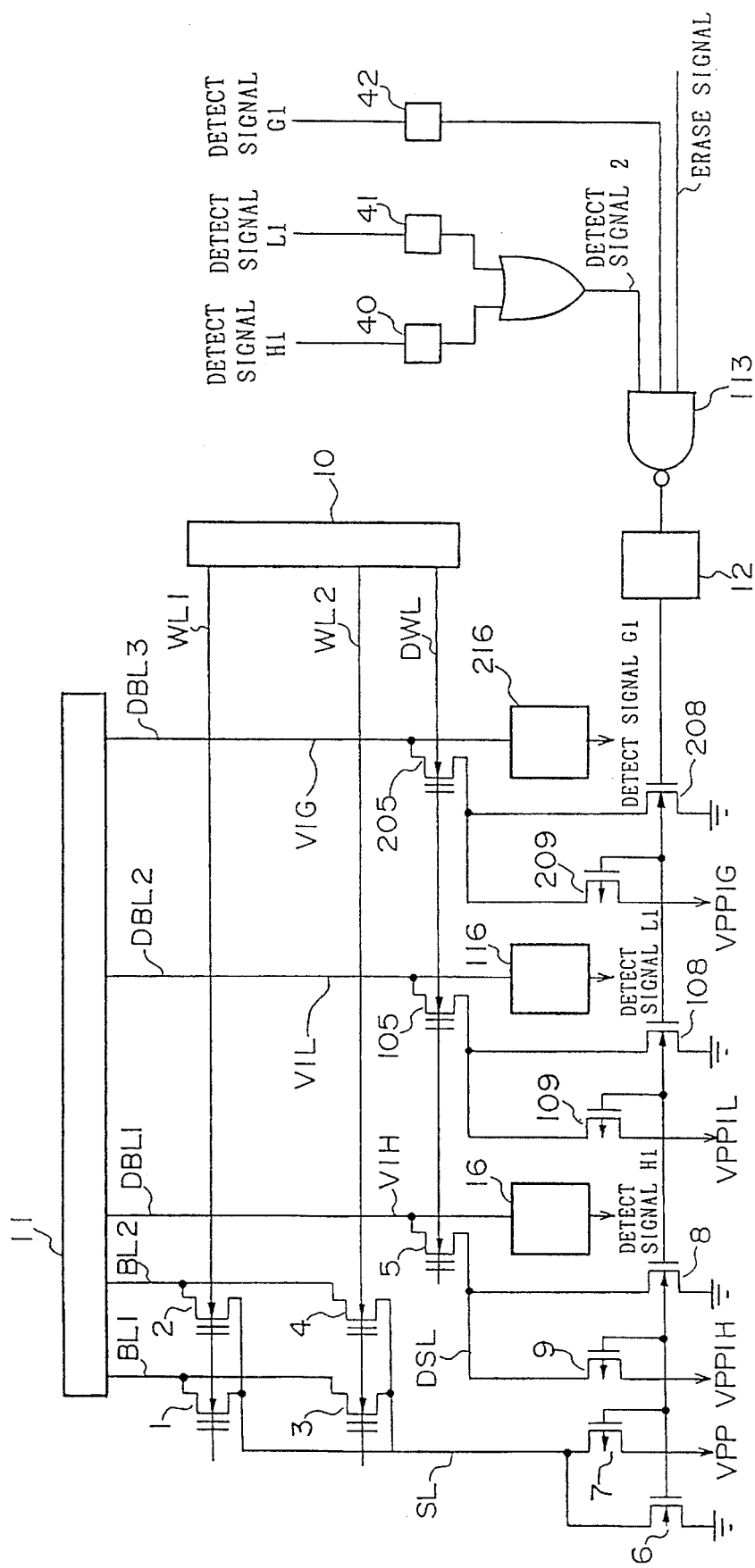
FIG. 4 is a circuit diagram of a modification of the second embodiment which comprises three dummy memory transistors.

FIG. 4 shows a modification of the second embodiment which newly comprises a dummy memory transistor 205, an N-channel transistor 208, a P-channel transistor 209, a voltage detecting circuit 216, 3NAND circuit 113 and a latch circuit 42 in addition to the parts of the second embodiment. The supply voltage Vpp1G is set such that the speed of threshold voltage change in the dummy memory transistor 205 is higher than those of all the memory transistors 1–4 and dummy memory transistor 5 (Vpp1G>Vpp1H>Vpp1L). However, it may be set to be Vpp1G=Vpp1H. The voltage detecting circuit 216 is defined such that a detect signal G1 becomes L-level when the threshold voltage in the dummy memory transistor 205 is equal to or lower than 0 V. The detect signal G1 is provided to the 3NAND circuit 118. As the detect signal G1 becomes L-level, the P-channel transistors 7, 9, 109 and 209 are turned off, the N-channel transistors 6, 8, 108 and 208 are turned on, irrespectively of the other detect signals H1 and L1. The voltage in the source line SL becomes GND-level to terminate the erasing process. As a result, it is ensured that the threshold voltages in the memory transistors 1–4 are not equal to or lower than 0 V (EF point in FIG. 5) at all times. Namely, the overerasing will reliably be avoided.

The second embodiment can simply provide a plurality of dummy memory transistors having different speeds of threshold voltage change. As a result, the overerasing can more positively be prevented while the logical invert level can more properly be set. These dummy memory transistors can be provided simply by changing supply voltages to be applied or by changing time at which the supply voltage begins to be applied. Therefore, the present invention can provide a threshold voltage setting means which is very effective and simple as being not expected in the prior art.

(3) Third Embodiment

Figure 6:
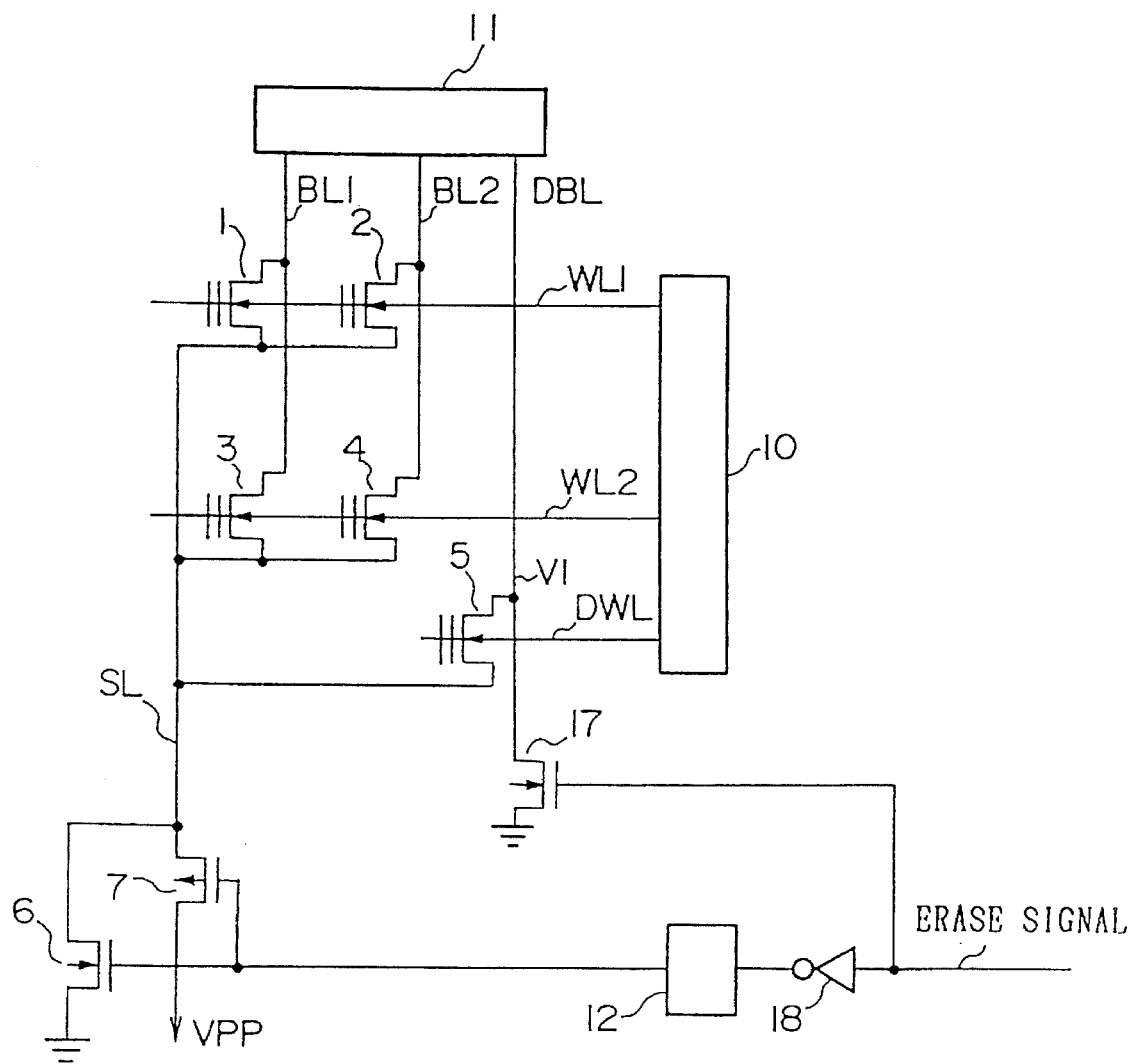
FIG. 6 is a circuit diagram of the third embodiment of a nonvolatile semiconductor system constructed in accordance with the present invention.

FIG. 6 shows a circuit diagram of the third embodiment of a nonvolatile semiconductor system constructed in accordance with the present invention, in which parts similar to those of FIG. 1 are denoted by similar reference numerals. The third embodiment further comprises a N-channel transistor 17 and an inverter circuit 18. The operation of the third embodiment will be described with reference to FIG. 7 which shows voltages in the system at various parts.

Figure 7:
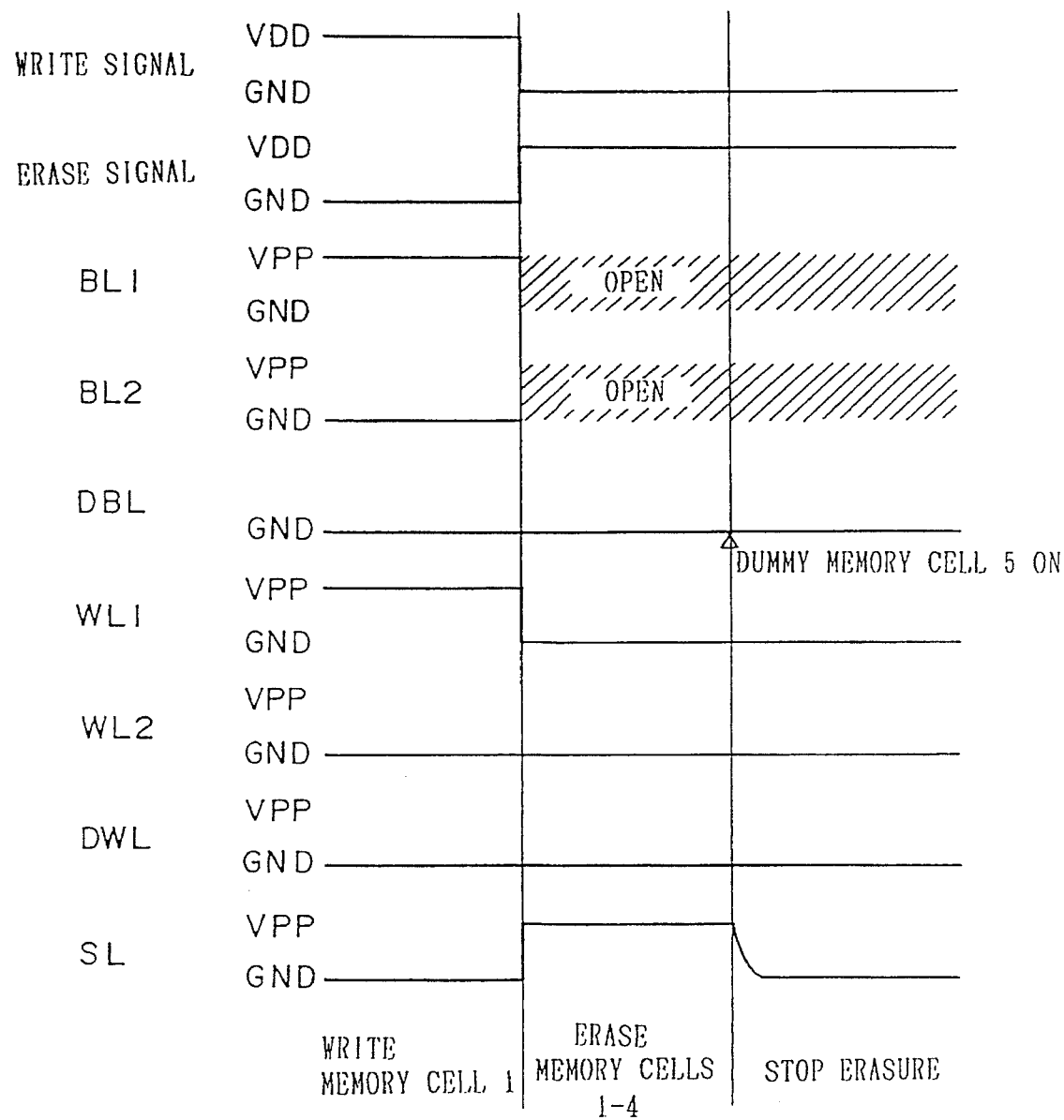
FIG. 7 is a view illustrating voltages in the third embodiment at difference parts to explain the operation thereof.

The writing process can be executed in the same manner as in the first embodiment when the erase signal becomes L-level, as shown in FIG. 7.

The erasing process will be described. Prior to the erasing process, the memory transistors 1–4 and dummy memory transistor 5 have been subjected to the aforementioned writing process. As shown in FIG. 7, the erase signal is then made H-level. The bit lines BL1 and BL2 are placed to receive no voltage through the write/erase control circuit 11. The dummy bit line DBL is set at GND-level by the N-channel transistor 17 having its gate electrode to which the erase signal is coupled. Under such a situation, the word lines WL1 and WL2 and the dummy wordline DWL are set at GND-level by the X-decoder circuit 10, as shown in FIG. 7. Thus, the voltages in the memory transistors 1–4 and dummy memory transistor 5 at their control gate electrodes become GND-level while the voltage SL at their source regions become Vpp-level. A tunnel current will be generated between the floating gate electrode and the source region in each of the transistors. As a result, electrons will be released from the floating gate electrode to the source region to perform the erasing process.

In the third embodiment, the capacitance between the control gate electrode and the floating gate electrode in the dummy memory transistor 5 is set to be higher than those of the memory transistors 1–4. Therefore, more tunnel current will be generated in the dummy memory transistor 5 than the memory transistors 1–4. As a result, the speed of threshold voltage change in the dummy memory transistor 5 becomes higher than those of the memory transistors 1–4. The reason will be described below.

It is now assumed that the capacitance between the control gate electrode and the floating gate electrode in the dummy memory transistor 5 is C1d and that the capacitance between the floating gate electrode and the source region in the dummy memory transistor 5 is C2d. It is also assumed that the capacitance between the control gate electrode and the floating gate electrode in each of the memory transistors 1–4 is C1n and that the capacitance between the floating gate electrode and the source region in the memory transistor is C2n. Further, a voltage difference to be applied between the control gate electrode and the source region in each transistor is assumed to be Vcs. Therefore, a voltage difference Vfsd between the floating gate electrode and the source region in the dummy memory transistor 5 can roughly be calculated to be:

$$Vfsd=(C1d \times Vcs)/(C1d+C2d).$$

Similarly, the voltage difference Vfsn between the floating gate electrode and the source region in each of the memory transistors can roughly be calculated to be:

$$Vfsn=(C1n \times Vcs)/(C1n+C2n).$$

If it is set to be C1d>C1n, the value Vfsd will be higher than the value Vfsn, as appreciated from the above formulas. Therefore, the voltage difference to be applied between the floating gate electrode and the source region in the dummy memory transistor will be higher than those of the memory transistors. As a result, the tunnel current is increased between the floating gate electrode and the source region in the dummy memory transistor. In such a manner, the speed of threshold voltage change in the dummy memory transistor 5 will be set to be higher than those of the memory transistors 1–4. As the erasing process proceeds to reduce the threshold voltage to a sufficiently low level, the dummy memory transistor 5 is turned on before the memory transistors 1–4 are turned on. If the power-supply-ability of the transistor 7 is set to be sufficiently lower than those of the transistors 5 and 17, the voltage in the source line SL is pulled down to GND-level through the N-channel transistor 17 to reduce that voltage. As the voltage in the source line SL is lowered, the tunnel current in each of the memory transistors 1–4 also decreases. As a result, the erasing process will ultimately be terminated.

In the third embodiment, the voltage V1 in the dummy bit line DBL can be supposed to be 0 V because V1 is extremely low. When the threshold voltage in the dummy memory transistor 5 becomes 0 V, thus, the dummy memory transistor is turned on. Therefore, if the capacitance in the dummy memory transistor 5 is set such that the threshold voltage thereof is reduced lower than those of all the memory transistors 1–4, the threshold voltages in the memory transistors 1–4 will never be negative. Namely, the overerasing will be avoided.

In the third embodiment, means for detecting the threshold voltage in the dummy memory transistor 5 is realized by setting the voltage in the dummy memory transistor 5 at the drain region at GND-level on the erasing process. For such a purpose, the third embodiment comprises the N-channel transistor 17 which receives the erase signal at the gate electrode thereof. Thus, the threshold voltage detecting means of the third embodiment can be realized by very simple circuit arrangement. Although the voltage detecting circuit 16 of the first embodiment is also of a relatively simple circuit arrangement, the threshold voltage detecting means of the third embodiment can be of more simplified circuit arrangement.

This threshold voltage detecting means is defined such that immediately when the dummy memory transistor 5 is turned on, the voltage in the source line SL is pulled down to GND-level to terminate the erasing process. Therefore, the third embodiment is very advantageous in that time required to terminate the erasing process after detection of the dummy memory transistor 5 being turned on can greatly be shortened. As a result, the overerasing can more reliably be prevented to highly improve the margins in design and process. In this connection, the first embodiment can also provide a relatively high-speed circuit compared with the prior art, since only the threshold voltage in the dummy memory transistor 5 is detected. However, in the first embodiment since after the detection of the dummy memory transistor 5 being turned on, the erasing process is terminated through the voltage detecting circuit 16, latch circuit 40, NAND circuit 13 and interface circuit 12, it will be apparent that the threshold voltage detecting means of the third embodiment has a speed higher than that of the first embodiment.

The threshold voltage detecting means also has a very high sensitivity of detection since the voltage in the source line SL is reduced to stop the erasing process at the same time when the dummy memory transistor 5 is turned on. If the dummy memory transistor 5 being turned on is detected by a multi-stage circuit such as N-channel transistor 17 or the like as in the first embodiment, the sensitivity will be lowered since the threshold voltage in the N-channel transistor 17 or the like has some range. On the contrary, the threshold voltage detecting means of the third embodiment can have a very increased sensitivity since the source line SL is pulled down to GND-level to terminate the erasing process in the memory transistors 1–4 immediately through the single state or dummy memory transistor 5 which is turned on.

Figure 8:
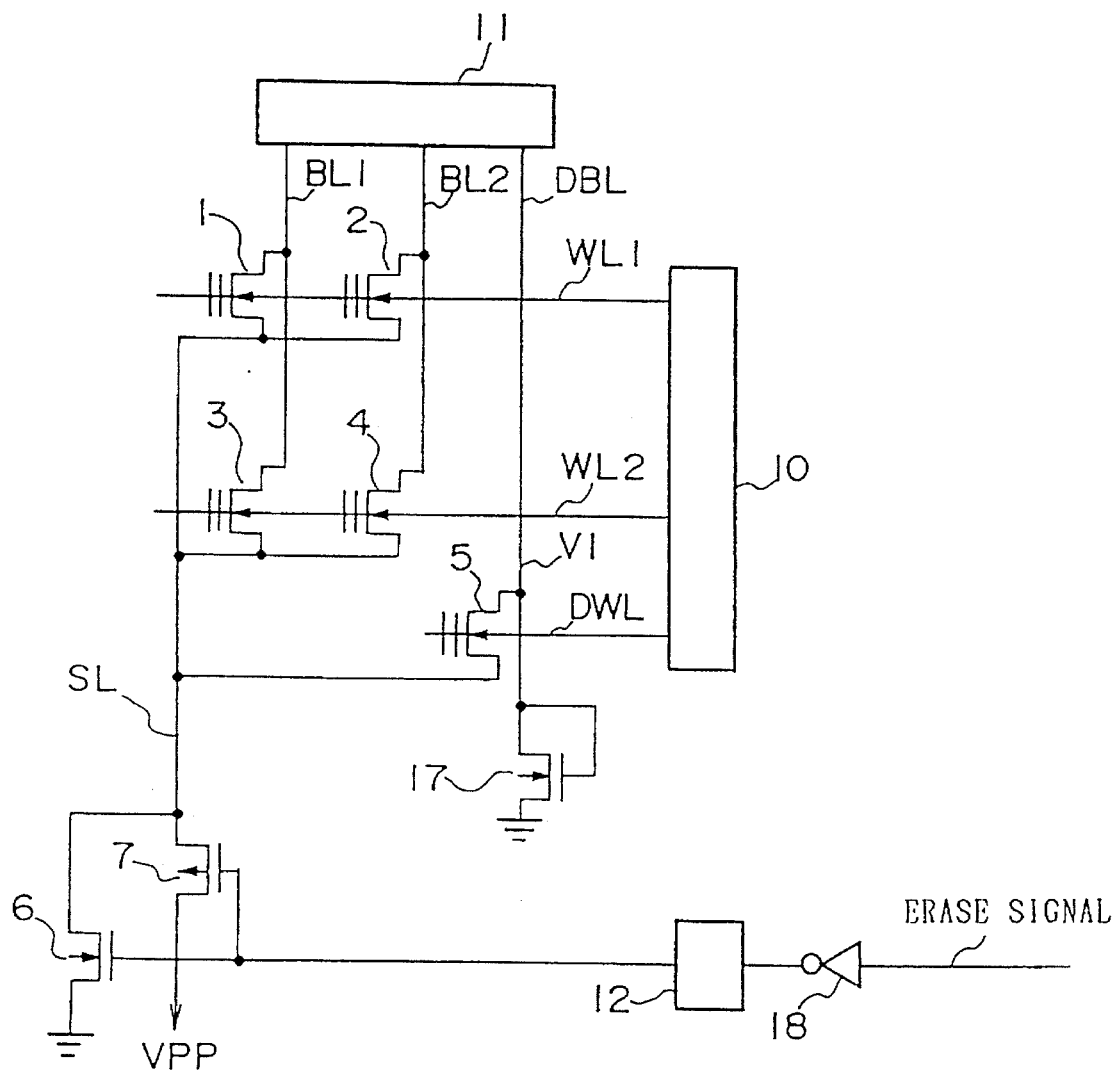
FIG. 8 is a circuit diagram of a modification of the third embodiment in which a voltage to be applied to the drain region of the dummy memory transistor in the third embodiment can be changed.

Although the third embodiment has been described as to the threshold voltage detecting means when the GND voltage is applied to the dummy memory transistor 5 at the drain region thereof, the present invention is not limited to such an arrangement. If such a circuit as shown in FIG. 8, that is, a circuit be connected as diode to the N-channel transistor 17 is provided, a voltage increased by the threshold voltage in the N-channel transistor will be applied to the drain region of the dummy memory transistor 5. Therefore, any dummy memory transistor having a lower threshold voltage may be provided without change of the process. In such a case, the circuit arrangement may more be simplified since no control of erase signal is required.

(4) Fourth Embodiment

Figure 9:
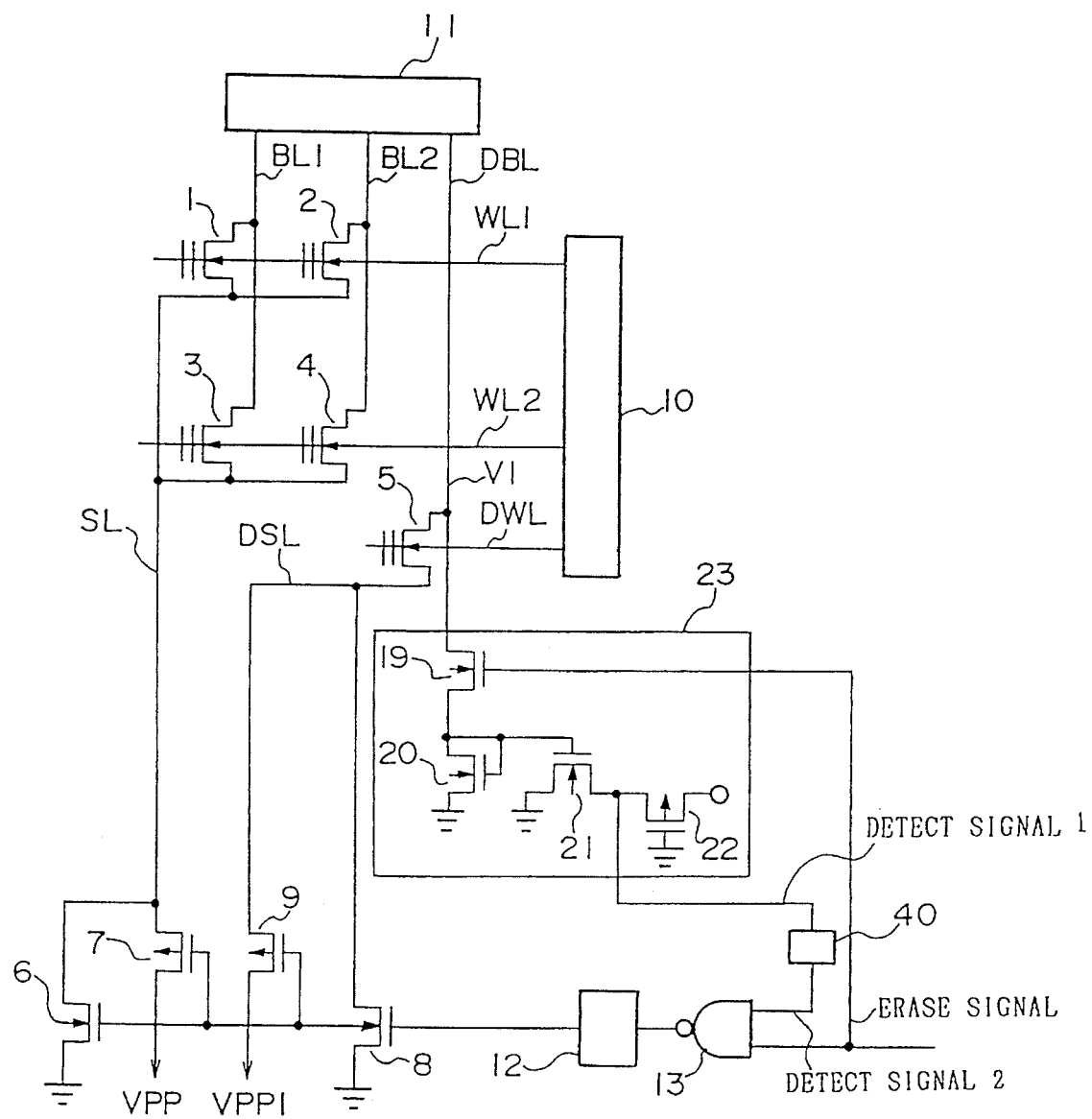
FIG. 9 is a circuit diagram of the fourth embodiment of a nonvolatile semiconductor system constructed in accordance with the present invention.

FIG. 9 shows a circuit diagram of the fourth embodiment of a nonvolatile semiconductor system constructed in accordance with the present invention, in which parts similar to those of FIG. 1 are designated by similar reference numerals. The nonvolatile semiconductor system comprises a current detecting circuit 23, N-channel transistors 19–21 and a P-channel transistor 22. The operation of the fourth embodiment will be described with reference to FIG. 10 which shows voltages in the system at various parts.

Figure 10:
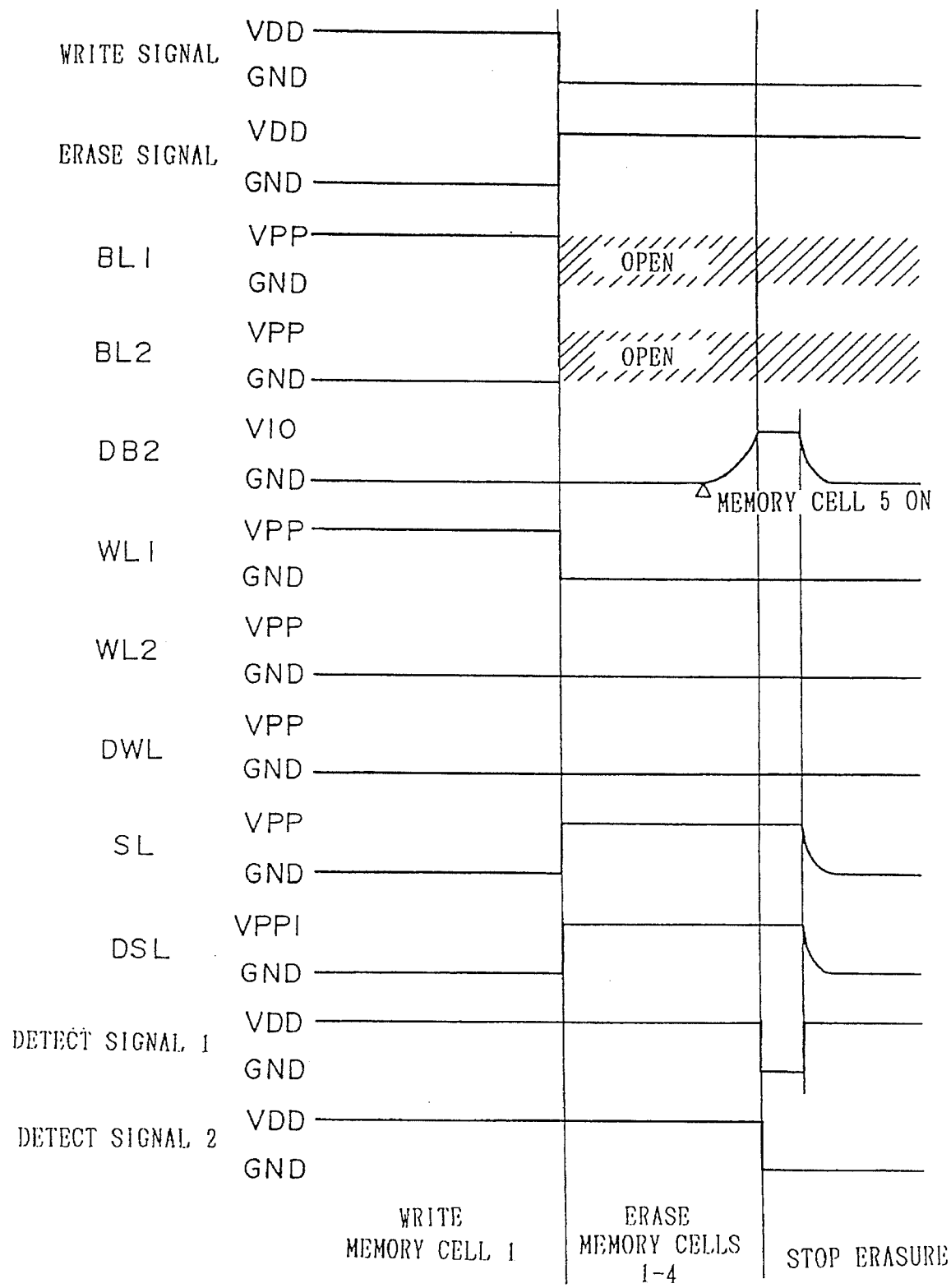
FIG. 10 is a view illustrating voltages in the fourth embodiment at various different parts to explain the operation thereof.

The writing process can be executed in the same manner as in the first embodiment when the erase signal becomes L-level, as shown in FIG. 10.

The erasing process will be described. Prior to the erasing process, the memory transistors 1–4 and dummy memory transistor 5 have been subjected to the aforementioned writing process. As shown in FIG. 10, the erase signal is then made H-level. The bit lines BL1 and BL2 and the dummy bit line DBL are placed to receive no voltage through the write/erase control circuit 11. In such settings, a detect signal 1 at the current detecting circuit 23 is pulled up to High-level by the P-channel transistor 22 and then latched by the latch circuit 40 before it is outputted as a detect signal 2 of H-level. As a result, the P-channel transistors 7 and 9 are turned on while the N-channel transistors 6 and 8 are turned off. Under such a condition, the word lines WL1 and WL2 and the dummy word line DWL are set to be at GND-level by the X-decoder circuit 10, as shown in FIG. 10. Thus, the voltages in the memory transistors 1–4 and dummy memory transistor 5 at their control gate electrodes are set at GND-level and the voltages in the source line SL and the dummy source line DSL are set to be Vpp-level and Vpp1-level, respectively. Therefore, a tunnel current is produced between the floating gate electrode and the source region in each of the transistors. As a result, electrons are released from the floating gate electrode into the source region to perform the erasing process.

If the supply voltage Vpp1 is higher than the supply voltage Vpp, the threshold voltage in the dummy memory transistor 5 will be reduced to be lower than the threshold voltages in the memory transistors 1–4. As the erasing process proceeds to reduce the threshold voltage to its sufficiently low level, the dummy memory transistor 5 is turned on before the memory transistors 1–4 are turned on. As a result, an electric current I1 will flow from the dummy source line DSL to the dummy bit line DBL. The power-supply-ability of the N-channel transistors 20 and 21 have been set to be sufficiently higher than that of the P-channel transistor 22. As shown in FIG. 10, thus, the current I1 becomes a set current I10. As the voltage in the dummy bit line DBL becomes V10, the detect signal 1 in the current detecting circuit 23 is switched to L-level and then latched by the latch circuit 40 before the detect signal 2 is outputted therefrom. As a result, the P-channel transistors 7 and 9 are turned off and the N-channel transistors 6 and 8 are turned on. As shown in FIG. 10, the voltage in the source line SL becomes GND-level to stop the erasing operation.

If the voltage Vpp1 has been set at any suitable level as in the first embodiment, the current flows to the dummy memory transistor 5 before the threshold voltages in the memory transistors 1–4 become negative. This can avoid the overerasing.

Although the fourth embodiment has been described as to the detect signal used directly as a signal for controlling the source voltage, it may be used also as a monitoring signal for preventing the overerasing to provide the same advantages as in the previous embodiments.

The first to fourth embodiments are such that on the erasing/writing operation, the threshold voltage in the dummy memory transistor is detected or monitored to maintain the threshold voltages in the memory transistors within a proper range. On the contrary, fifth and sixth embodiments which will be described are such that after the erasing or writing step, a verifying operation will be performed to check what level the threshold voltage in the dummy memory transistor is reduced to. Thus, the threshold voltages in the memory transistors can be maintained within a proper range. For example, such a verifying operation is repeated alternately with an erasing operation sufficiently weak to raise no rapid reduction in the threshold voltage. If the erasing operation is terminated as the detect signal is switched from one to another level, the set threshold voltages can more reliably be maintained while the overerasing can more positively be prevented.

(5) Fifth Embodiment

Figure 11:
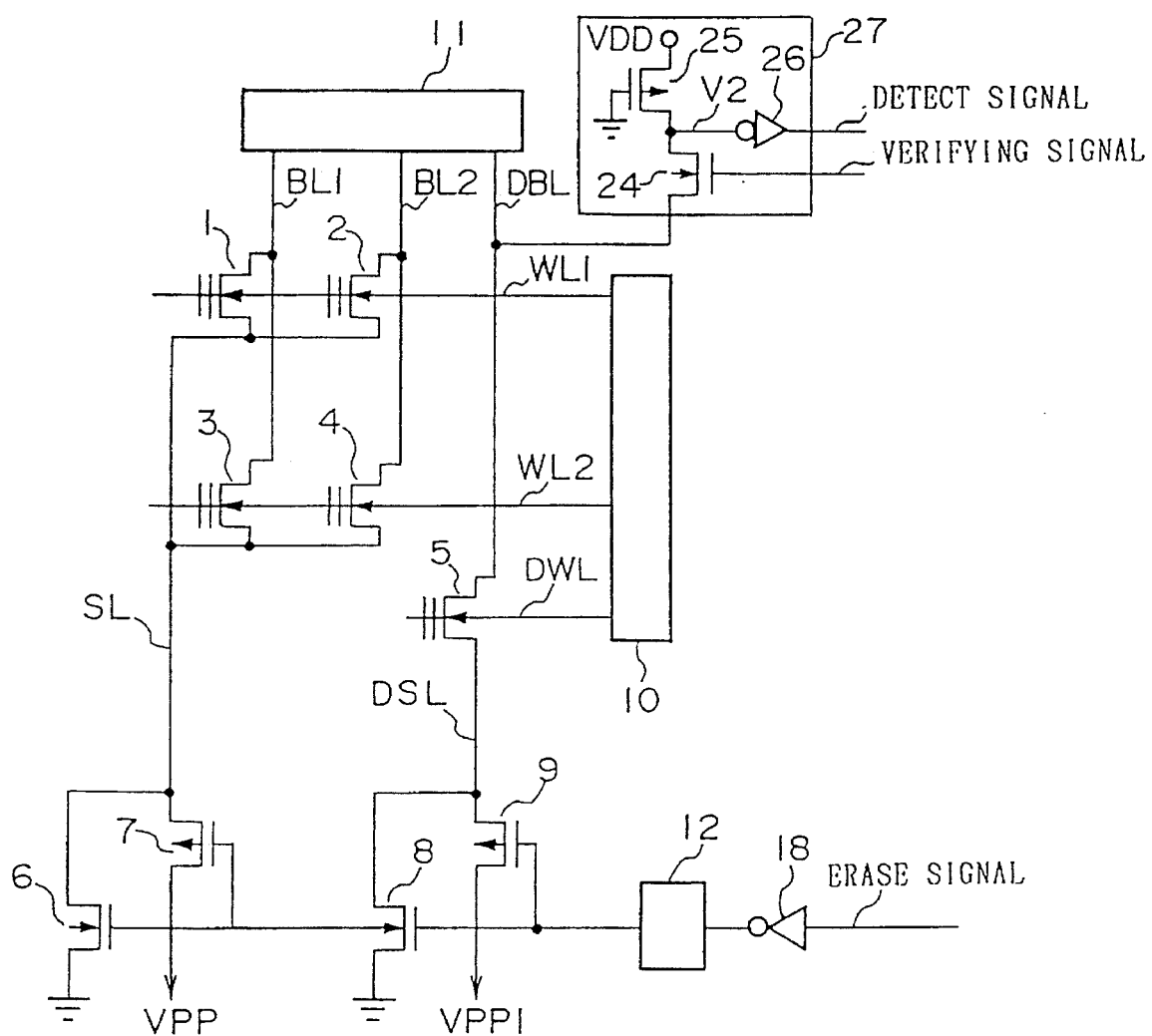
FIG. 11 is a circuit diagram of the fifth embodiment of a nonvolatile semiconductor system constructed in accordance with the present invention.

FIG. 11 shows a circuit diagram of the fifth embodiment of a nonvolatile semiconductor system constructed in accordance with the present invention, in which parts similar those of FIGS. 1 and 2 are denoted by similar reference numerals. A threshold voltage detecting circuit 27 comprises an N-channel transistor 24, a P-channel transistor 25 and an inverter circuit 26. The operation of the fifth embodiment will be described with reference to FIG. 12 which shows voltages in the system at various parts.

Figure 12:
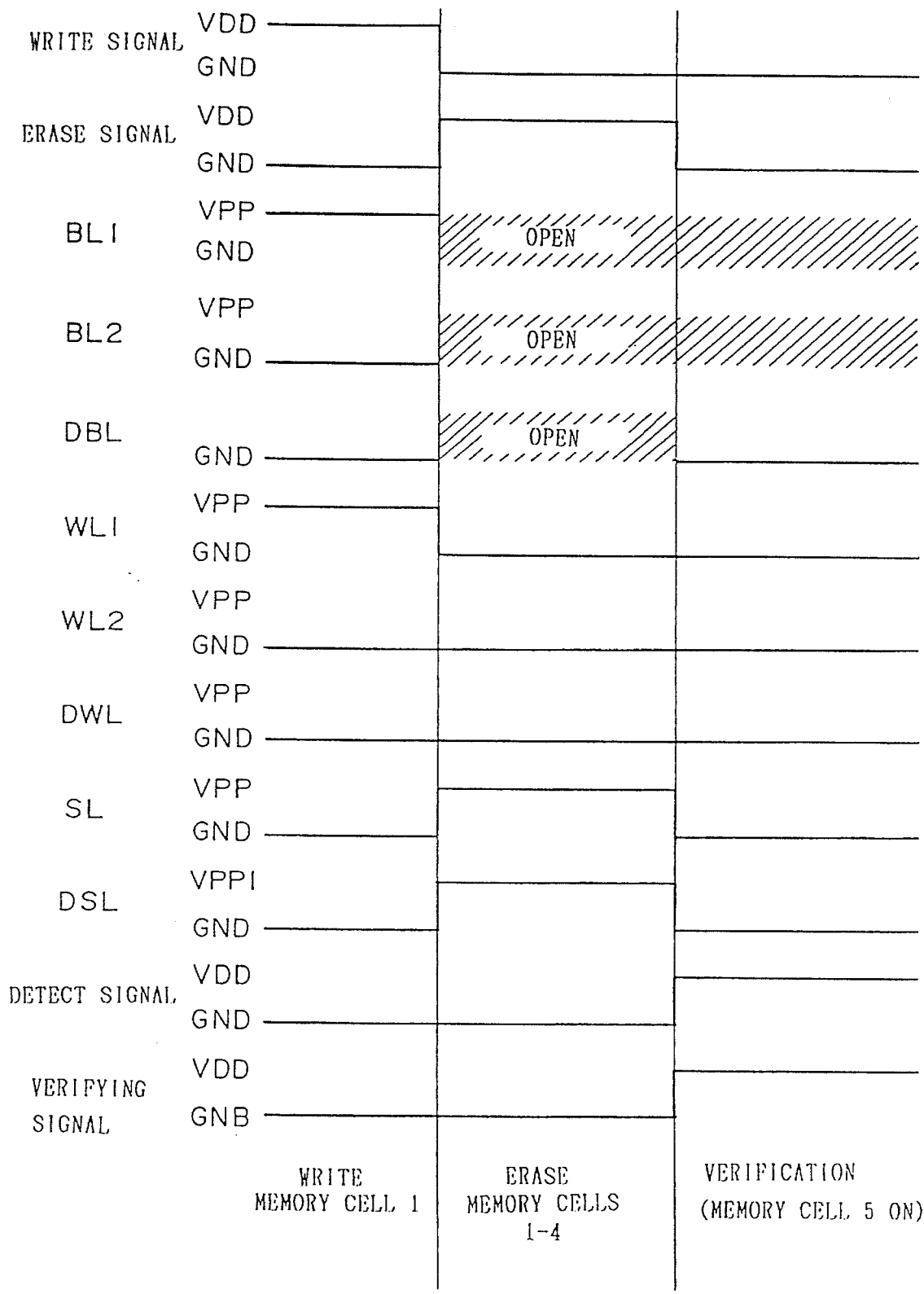
FIG. 12 is a view illustrating voltages in the fifth embodiment at various different parts to explain the operation thereof.

The writing process can be executed in the same manner as in the first embodiment when the erasing and verifying signals respectively become L-level, as shown in FIG. 12.

The erasing process will be described. Prior to the erasing process, the memory transistors 1–4 and dummy memory transistor 5 have been subjected to the aforementioned writing process. As shown in FIG. 12, the erasing and verifying signals are then made H-level and L-level, respectively. The transistors 6, 8 and 24 are turned off and the transistors 7 and 9 are turned on. Further, the bit lines BL1 and BL2 and the dummy bit line DBL are placed to receive no voltage through the write/erase control circuit 11. Under such a situation, the word lines WL1 and WL2 and the dummy word line DWL are set at GND-level by the X-decoder circuit 10, as shown in FIG. 12. Thus, the voltages in the memory transistors 1–4 and dummy memory transistor 5 at their control gate electrodes become GND-level while the voltages in the source line SL and the dummy source line DSL become Vpp-level and Vpp1-level, respectively. A tunnel current will be generated between the floating gate electrode and the source region in each of the transistors. As a result, electrons will be released from the floating gate electrode to the source region to perform the erasing process.

After the erasing process, the verifying operation is performed to check what level the threshold voltages in the memory transistors are reduced to. On the verifying process, the erasing and verifying signals are made L-level and H-level, respectively, as shown in FIG. 12. As a result, the transistors 6, 8 and 24 are turned on and the transistors 7 and 9 are turned off. The write/erase control circuit 11 causes the bit lines BL1 and BL2 and the dummy bit line DBL to receive no supply voltage while the X-decoder circuit 10 causes the word lines WL1 and WL2 and the dummy word line DWL to be set at GND-level. If the threshold voltage in the dummy memory transistor 5 is equal to or higher than 0 V, it will be turned off. As a result, the voltage V2 in the threshold voltage detecting circuit 27 is made H-level by pulling-up of the P-channel transistor 25 and the detect signal becomes L-level.

On the other hand, if the threshold voltage in the dummy memory transistor 5 is lower than 0 V, it will be turned on. At this time, the power-supply-ability of the transistor 25 has been set to be sufficiently lower than those of the transistors 5, 8 and 24. Thus, the voltage V2 in the threshold voltage detecting circuit 27 becomes L-level to make the detect signal H-level, as shown in FIG. 12. As a result, the shift of the detect signal from L-level to H-level will enable to detect the threshold voltage in the dummy memory transistor 5.

If the supply voltage Vpp1 is set to be higher than the supply voltage Vpp, the speed of threshold voltage change in the dummy memory transistor 5 becomes higher than those of the memory transistors 1–4. Simply by detecting or verifying only the threshold voltage in the dummy memory transistor 5, therefore, it is ensured that the threshold voltages in the memory transistors 1–4 are maintained equal to or higher than a set voltage to avoid the overerasing.

The verifying operation is repeated alternately with an erasing operation sufficiently weak to raise no rapid reduction in the threshold voltage. If the erasing operation is terminated as the detect signal is switched from one to another level, the set threshold voltages can more reliably be maintained while the overerasing can more positively be prevented.

Although the fifth embodiment has been described as to the verifying operation performed when the dummy word line DWL is at GND-level, it is easily understood that the same advantages as in the previous embodiment can be provided by the fifth embodiment even if the voltage is equal to a positive value V3, except that the detect signal is shifted from one to another level as the threshold voltage in the dummy memory transistor 5 becomes V3.

The first to fifth embodiments have been described as to that the dummy memory transistor having its speed of threshold voltage change different from those of the memory transistors is provided by changing the source voltage or capacitance. However, the invention is not limited to it but may be applied in various modifications such as change of time at which the supply voltage begins to be applied to the dummy memory transistor or change of the initial threshold voltage at which there is no electron in the floating gate electrode thereof. It is easily understood that such modifications can provide the same advantages as in the previous embodiments.

Although the fifth embodiment has been described as to the detection of the threshold voltage in the dummy memory transistor 5 which is performed by the threshold voltage detecting means 27 for detecting the voltage in the dummy bit line DBL, the present invention is not limited to such an arrangement. For example, the threshold voltage may be detected by applying a given voltage to the dummy memory transistor 5 at the drain region thereof, as in the third embodiment of FIG. 6. Furthermore, the threshold voltage can be detected by detecting the current flowing in the dummy bit lines, as in the fourth embodiment of FIG. 9.

Figure 13:
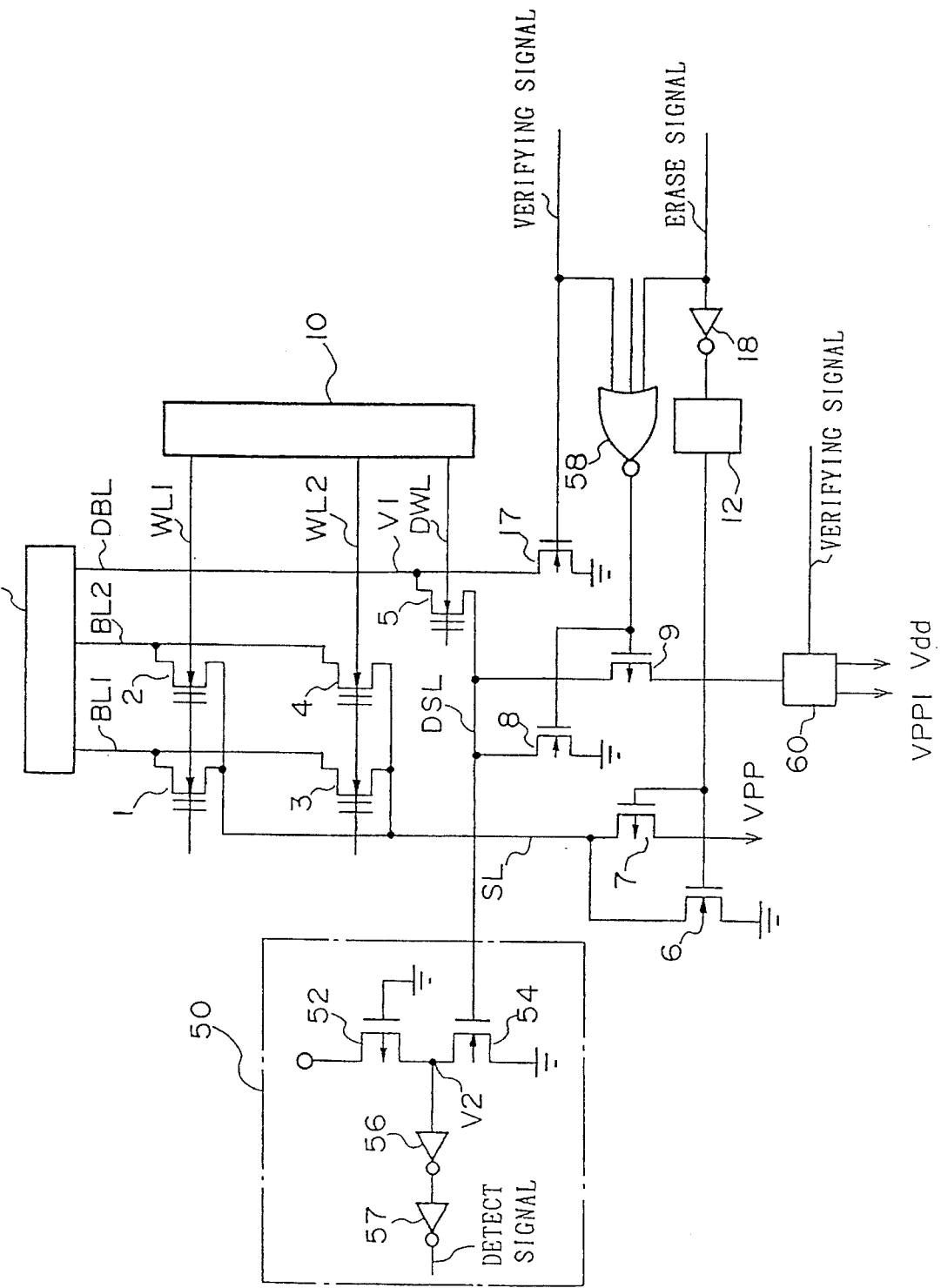
FIG. 13 is a circuit diagram of a modification of the fifth embodiment in which the threshold voltage detecting means is realized by applying a voltage to the drain region.

FIG. 13 shows an arrangement which can detect the threshold voltage in the dummy memory transistor 5 by applying the GND voltage thereto at the drain region. As shown in FIG. 13, a verifying signal is supplied to the N-channel transistor 17 at the gate electrode thereof. On the verifying operation, thus, the GND voltage is applied to the dummy memory transistor 5 at the drain region. The verifying and erase signals are inputted into a NOR circuit 58 the output of which is supplied to the N- and P-channel transistors 8 and 9. A switching circuit 60 functions to switch the supply voltage Vpp1 to Vdd or vice versa. When the verifying signal is at L-level, the switching circuit 60 selects the supply voltage Vpp1. When the verifying signal is at H-level, the switching circuit 60 selects the supply voltage Vdd. As a result, the supply voltage to the N-channel transistor 9 and dummy memory transistor 5 can be changed.

The reduction in the voltage of the source line SL will be detected to detect the threshold voltage in the dummy memory transistor by a threshold voltage detecting circuit 50 which comprises a P-channel transistor 52, a N-channel transistor 54 and inverter circuits 56 and 57.

The operation of this circuit will be described below.

The writing process will be executed when the erasing and verifying signals are made L-level, as in the first embodiment.

When the erasing and verifying signals are respectively made H-level and L-level, the erasing process is initiated in the same manner as shown in FIG. 11. Since the switching circuit 60 has selected the supply voltage Vpp1 at this time, the supply voltage Vpp1 will be supplied to the dummy memory transistor 5.

After the erasing process, the erasing and verifying signals are respectively made L-level and H-level to execute the verifying process. Since the N-channel transistor 17 is turned on at this time, the dummy bit line DBL is set to be at GND-level. The N-channel transistor 8 is turned off while the P-channel transistor 9 is turned on. The switching circuit 60 selects the supply voltage Vdd. The dummy source line DSL is thus set at Vdd-level. At this time, the dummy word line DWL has been placed at GND-level. Since the dummy source line DSL has been set at Vdd-level, the erasing operation will not be performed in the dummy memory transistor 5.

If the threshold voltage in the dummy memory transistor 5 is equal to or higher than 0 V under the above condition, the dummy source line DSL is made Vdd-level since the dummy memory transistor 5 is in its OFF state. The power-supply-ability of the P-channel transistor 52 has been set to be sufficiently lower than that of the N-channel transistor 54. Consequently, the voltage V2 in the threshold voltage detecting circuit 50 becomes L-level while the detect signal also becomes L-level.

If the threshold voltage in the dummy memory transistor 5 becomes lower than 0 V, the dummy memory transistor 5 is turned on to reduce the voltage in the dummy source line DSL. In this case, the power-supply-ability of the P-channel transistor 9 has been set to be sufficiently lower than those of the dummy memory transistor 5 and N-channel transistor 17. When the voltage in the dummy source line DSL is reduced to a level lower than the threshold voltage in the N-channel transistor 54, therefore, the voltage V2 in the threshold voltage detecting circuit 50 becomes H-level and the detect signal also becomes H-level. Consequently, the threshold voltage in the dummy memory transistor 5 will be detected by switching the detect signal from L-level to H-level.

(6) Sixth Embodiment

Figure 14:
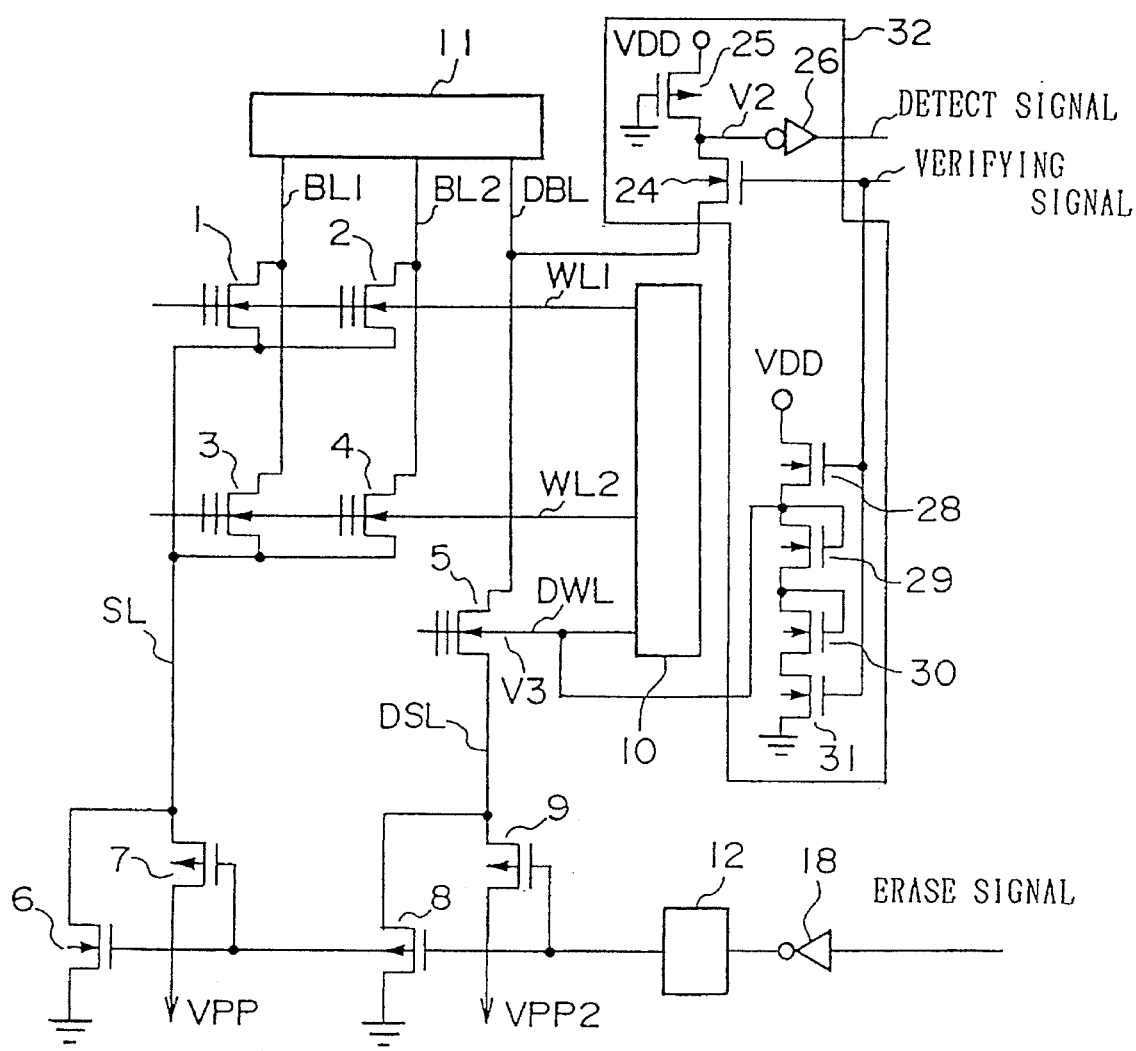
FIG. 14 is a circuit diagram of the sixth embodiment of a nonvolatile semiconductor system constructed in accordance with the present invention.

FIG. 14 shows a circuit diagram of the sixth embodiment of a nonvolatile semiconductor system constructed in accordance with the present invention, in which parts similar to those of FIG. 11 are designated by similar reference numerals. A threshold voltage detecting circuit 32 is defined by N-channel transistors 28– 31. The operation of the sixth embodiment will be described with reference to FIG. 15 which shows voltages in the system at various parts.

The writing process can be executed in the same manner as in the first embodiment when the erasing and verifying signals respectively become L-level.

The erasing process will be described. The erasing process may be executed as in the fifth embodiment when the erasing and verifying signals are made H-level and L-level, respectively.

Figure 15:
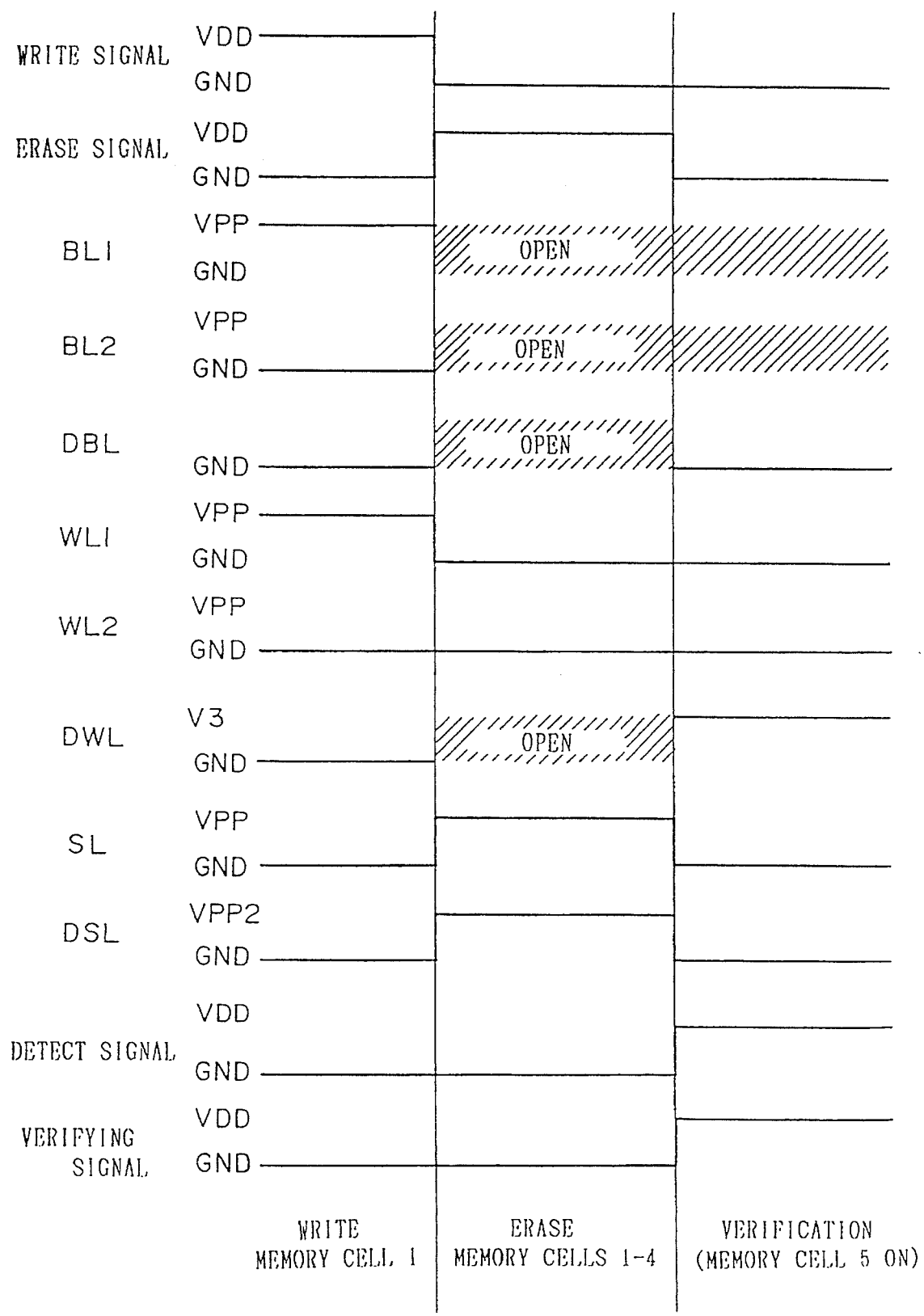
FIG. 15 is a view illustrating voltages in the sixth embodiment at various different parts to explain the operation thereof.

After the erasing process has been completed, a verifying operation is executed to check what level the threshold voltages in the memory transistors have been reduced to. In the verifying operation, as shown in FIG. 15, the erasing and verifying signals are respectively made L-level and H-level so that the transistors 6, 8, 24, 28 and 31 are turned on and the transistors 7 and 9 are turned off. The write/erase control circuit 11 causes the bit lines BL1 and BL2 and the dummy bit line DBL to receive no voltage. The X-decoder circuit 10 sets the word lines WL1 and WL2 at GND level and also causes the dummy word line DWL to receive no voltage. The power-supply-ability in the N-channel transistors 29–31 is set to be sufficiently higher than that of the N-channel transistor 28. A constant voltage V3 which is not dependent on the supply voltage Vdd is applied to the dummy word line DWL. If the threshold voltage in the dummy memory transistor 5 is equal to or higher than V3, the dummy memory transistor 5 is turned off. As a result, the voltage V2 in the threshold voltage detecting circuit 32 is shifted to H-level with the detect signal becoming L-level, by the pulling-up in the P-channel transistor 25.

On the other hand, if the threshold voltage in the dummy memory transistor 5 is lower than V3, the dummy memory transistor 5 is turned on. In this case, the power-supply-ability of the transistor 25 has been set to be sufficiently lower than those of the transistors 5, 8 and 24. Therefore, the voltage V2 in the threshold voltage detecting circuit 32 is made L-level and the detect signal is made H-level. As a result, the threshold voltage in the dummy memory transistor 5 can be detected when the detect signal is switched from L-level to H-level.

If the voltage Vpp2 has been set to be lower the voltage Vpp, the speed of threshold voltage change in the dummy memory transistor 5 becomes lower than those of the memory transistors 1–4. It is thus ensured that if the threshold voltage in the dummy memory transistor 5 has been detected or verified, it can be judged whether or not the threshold voltages in the memory transistors 1–4 are reduced to a level equal to or lower than a set voltage. Thus, the overerasing can be prevented.

The verifying operation is repeated alternately with an erasing operation sufficiently weak to raise no rapid reduction in the threshold voltage. If the erasing operation is terminated as the detect signal is switched from one to another level, the set threshold voltages can more reliably be maintained while the overerasing can more positively be prevented.

Although the sixth embodiment has been described as to that the dummy memory transistor having its speed of threshold voltage change different from those of the memory transistors is provided by changing the source voltage, this can be attained by any measure such as change of time at which the source voltage begins to be applied to the dummy memory transistor, change of the initial threshold voltage at which there is no electron in the floating gate electrode, change of the capacitance between the control gate electrode and the floating gate electrode or the like. In any event, it is appreciated that the sixth embodiment can provide the same advantages as in the previous embodiments.

Although the fifth and sixth embodiments have been described as to a single dummy memory transistor, the present invention may be applied to any arrangement in which a plurality of dummy memory transistors are provided, as in the second embodiment. One example is shown in FIG. 16.

Figure 16:
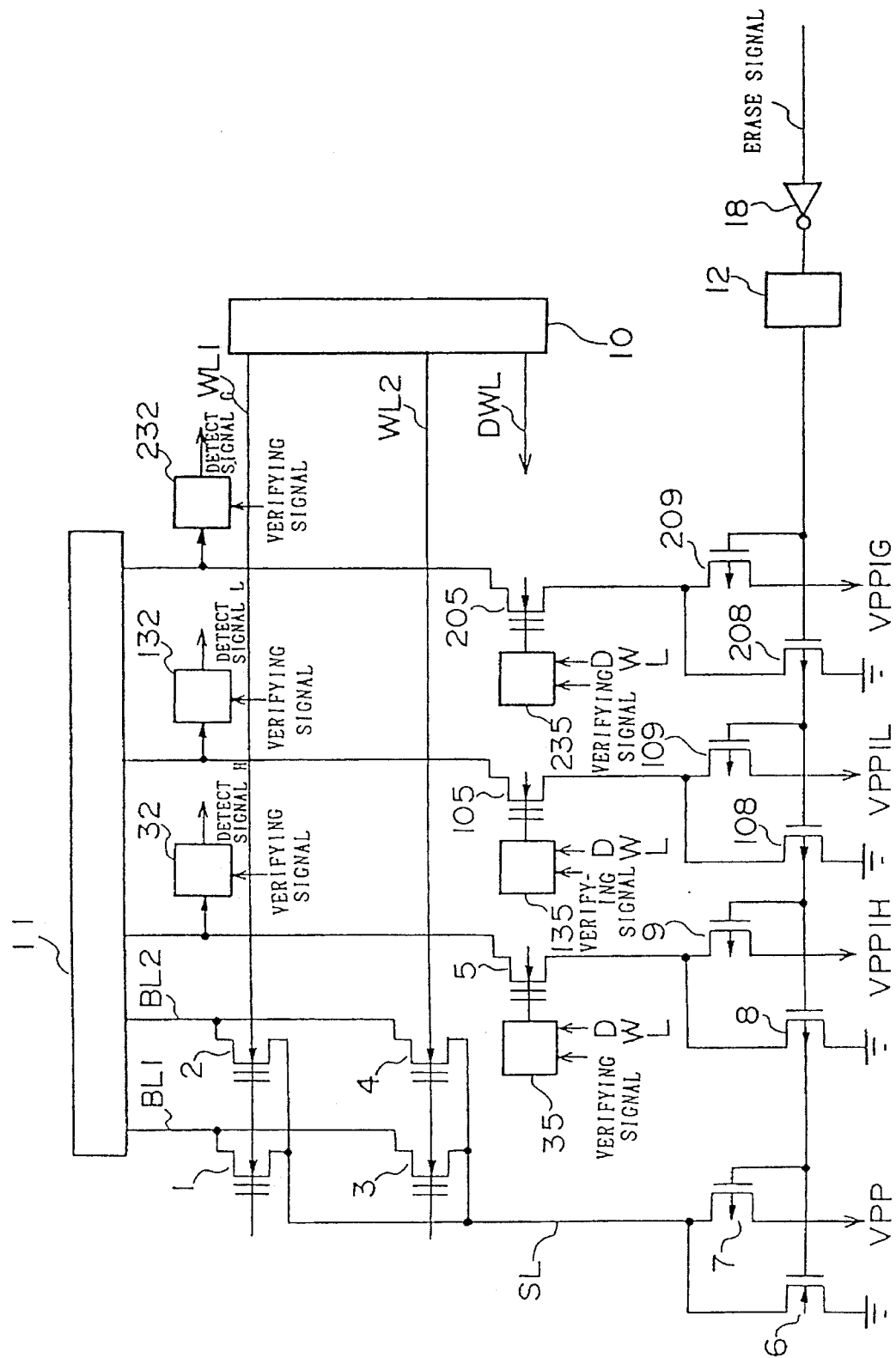
FIG. 16 is a circuit diagram of a modification of the sixth embodiment which comprises three dummy memory transistors.

FIG. 16 shows a circuit which comprises dummy memory transistors 105 and 205, threshold voltage detecting circuits 132 and 232, constant voltage circuits 35, 135 and 235, N-channel transistors 8, 108 and 208 and P-channel transistors 9, 109 and 209 in addition to the circuit shown in FIG. 14.

The dummy memory transistors 5, 105 and 205 have different voltages Vpp1H, Vpp1L and Vpp1G (Vpp1G>Vpp1H>Vpp1L) to be applied to their source regions, respectively. Thus, the speed of threshold voltage change in each of the dummy memory transistors is set to be different from those of the other dummy memory transistors. However, the voltage Vpp1G may be set to be equal to the voltage Vpp1H.

The constant voltage circuits 35, 135 and 235 are substantially of the same structure as that of the constant voltage circuit defined by the N-channel transistors 28, 29 and 30 in the embodiment of FIG. 14. However, the constant voltages to be outputted may be set to be 0 V in the constant voltage circuit 235, 1.0 V in the constant voltage circuit 35 and 3.5 V in the constant voltage circuit 135. The threshold voltage detecting circuits 132 and 232 are substantially of the same structure as that of the threshold voltage detecting circuit 32.

In such an arrangement, the threshold voltage can be checked at various levels. For example, the detect signal H in the threshold voltage detecting circuit 32 may be monitored on verifying operation to check whether or not the threshold voltages in the memory transistors 1–4 are equal to or lower than 1.0 V. Further, the detect signal L in the threshold voltage detecting circuit 132 may be monitored on verifying operation to check whether or not the threshold voltages in the memory transistors 1–4 are equal to or lower than 3.5 V. Similarly, the detect signal G in the threshold voltage detecting circuit 232 may be monitored on verifying operation to check whether or not the threshold voltages in the memory transistors 1–4 are equal to or lower than 0 V. In other words, it can be checked whether or not there is an overerasing.

By performing the verifying operation while checking the threshold voltage at various levels in such a manner, the threshold voltage can be optimized with very improved accuracy. For example, even if the threshold voltages in the memory transistors are reduced to decrease the margin, the threshold voltages can be set within a proper range as in the prior art. In addition, the sixth embodiment is very advantageous in that the speed of threshold voltage change in the dummy memory transistor can be changed by any suitable and simple manner such as by changing the supply voltage or the like while enabling the highly improved verifying operation.

The present invention is not limited to the aforementioned embodiments, but may be carried out in various modified and changed forms within the scope of the invention.

Figure 17:
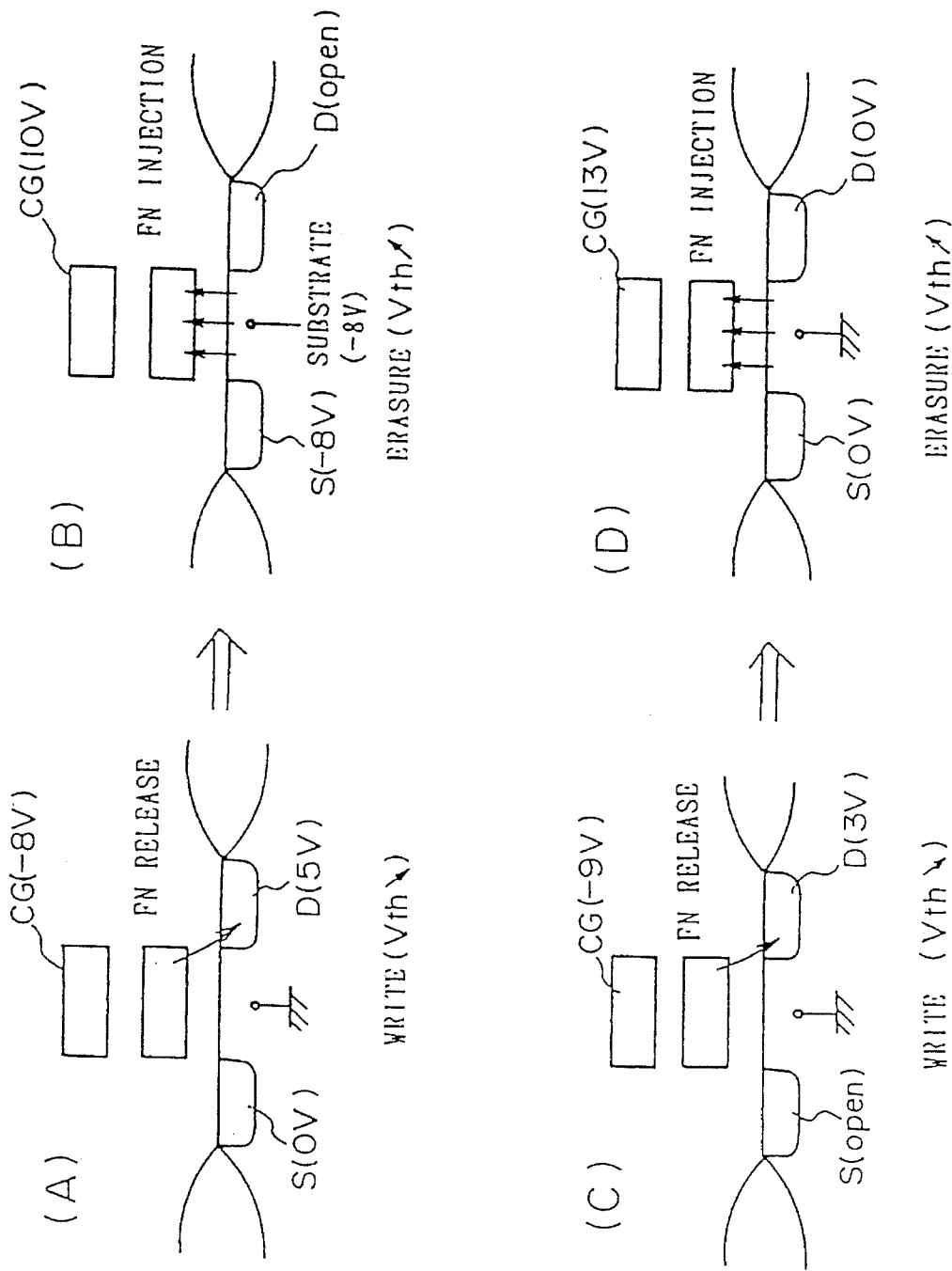
FIGS. 17(A)–17(D) are a cross-sectional view of memory transistors performing the other writing and erasing operations.
Figure 18:
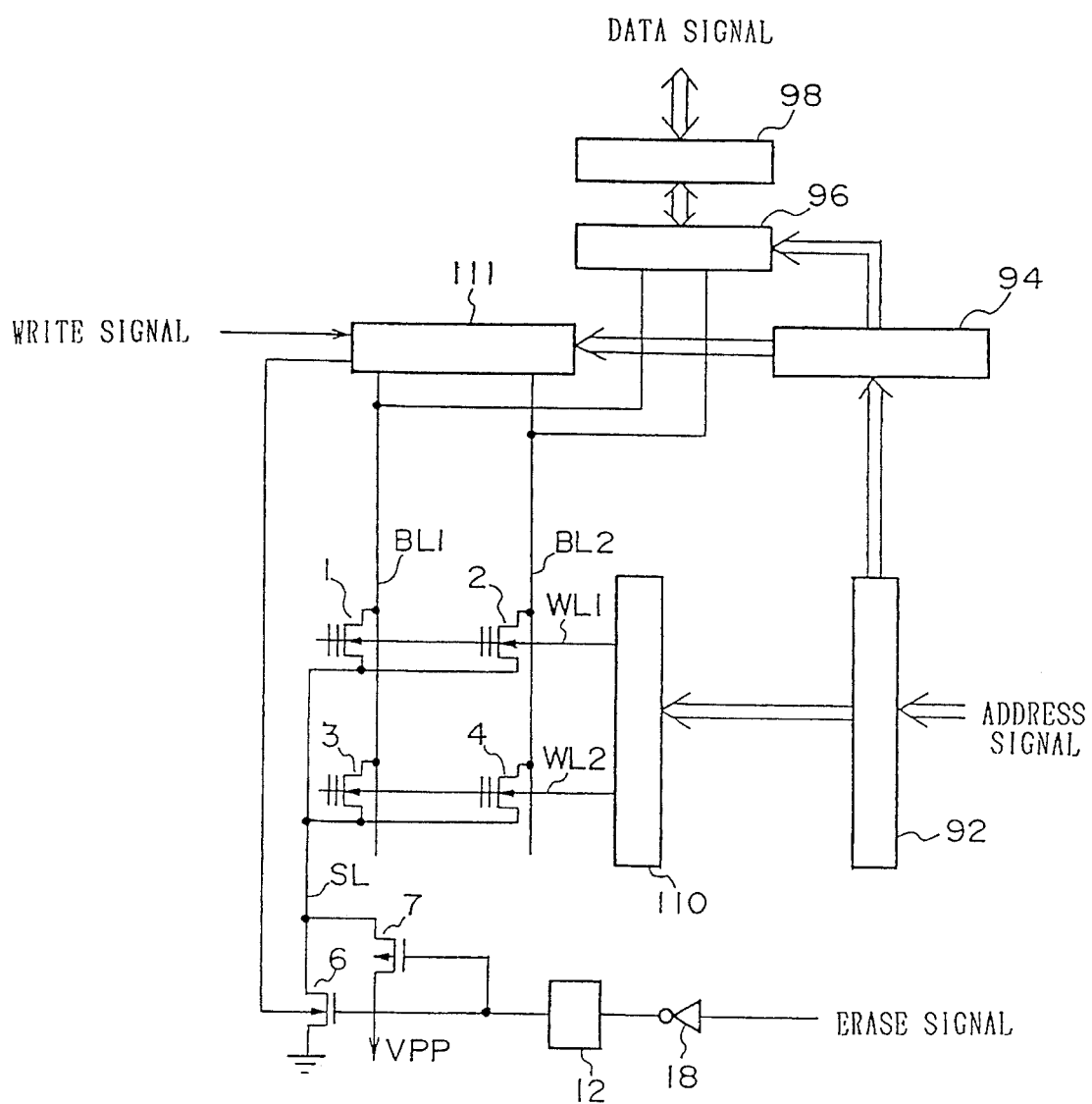
FIG. 18 is a circuit diagram of a nonvolatile semiconductor system constructed in accordance with the prior art.
Figure 19:
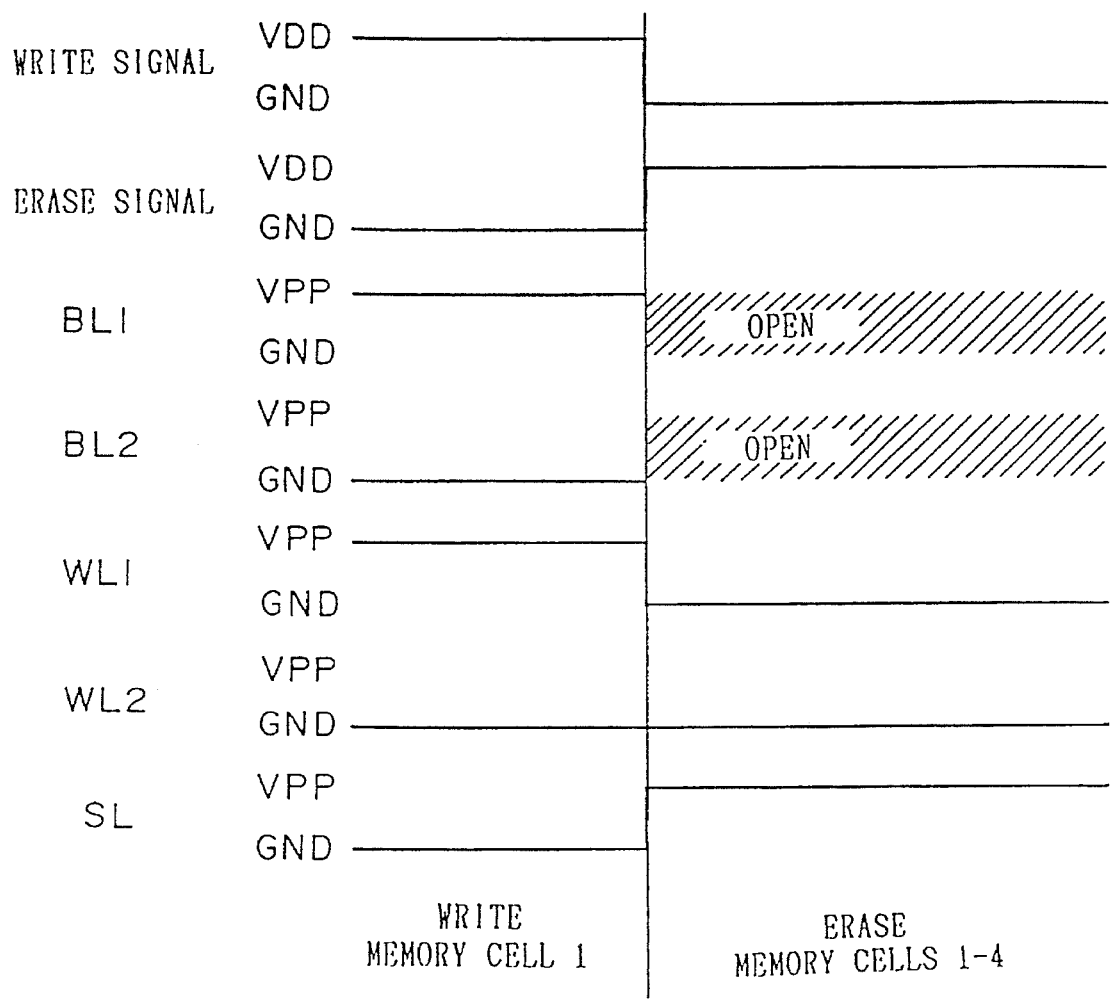
FIG. 19 is a view illustrating voltages in the prior art system at various different parts to explain the operation thereof.

The embodiments of the present invention have been described as to that the writing step is carried out by injecting hot electrons into the floating gate electrode and that the erasing step is made by releasing electrons through the tunnel current. However, the present invention may be applied to any other memory cell if the threshold voltage is regulated by injection/release of electrons relative to the floating gate electrode, irrespectively of hot electrons or tunnel current. In addition, electrons may be injected into and/or released from any one of drain region, source region and semiconductor substrate, irrespectively of the writing or erasing operation. Therefore, the present invention may be applied to such a memory cell as shown in FIGS. 17(A), 17(B) or 17(C), 17(D). More particularly, in FIGS. 17(A) and 17(C), the writing process is being carried out by releasing electrons into the drain region through the tunnel current. In FIGS. 17(B) and 17(D), the erasing process is being executed similarly by injecting electrons from the semiconductor substrate through the tunnel current.

I claim:

1. A nonvolatile semiconductor system comprising:
   a memory transistor comprising a floating gate electrode, a control gate electrode and first and second diffusion layers, said memory transistor storing data by injecting electrons into said floating gate electrode and releasing electrons from said floating gate electrode;
   at least one dummy memory transistor comprising a floating gate electrode, a control gate electrode and first and second diffusion layers, a change rate of threshold voltage of said at least one dummy memory transistor being different from a change rate of threshold voltage of said memory transistor;
   means for causing electrons to be injected into said at least one dummy memory transistor and for causing electrons to be released from said at least one dummy memory transistor; and
   means for detecting the threshold voltage of said at least one dummy memory transistor when the electrons are released from said floating gate electrode of the memory transistor and the at least one dummy memory transistor.

2. The nonvolatile semiconductor system of claim 1, wherein said at least one dummy memory transistor comprises a first dummy memory transistor and a second dummy memory transistor, a change rate of threshold voltage of said first dummy memory transistor being greater than the change rate of threshold voltage of said memory transistor, a change rate of threshold voltage of said second dummy memory transistor being less than the change rate of threshold voltage of said memory transistor, whereby the threshold voltage of said memory transistor is set within a proper range on the injection/release of electrons.

3. The nonvolatile semiconductor system of claim 2, wherein the change rate of threshold voltage of at least one of the first and second dummy memory transistors is set by applying a voltage to one of the first diffusion layer and the second diffusion layer of said at least one of the first and second dummy memory transistors, said voltage applied to said at least one of the first and second dummy memory transistors being different from a voltage applied to one of the first diffusion layer and the second diffusion layer of said memory transistor.

4. The nonvolatile semiconductor system of claim 1, wherein the change rate of threshold voltage of the at least one dummy memory transistor is set by applying a voltage to one of the first diffusion layer and the second diffusion layer of said at least one dummy memory transistor, said voltage applied to said at least one dummy memory transistor being different from a voltage applied to one of the first diffusion layer and the second diffusion layer of said memory transistor.

5. The nonvolatile semiconductor system of claim 1, wherein the change rate of threshold voltage of the at least one dummy memory transistor is set by a voltage application time to one of the first diffusion layer and the second diffusion layer of said at least one dummy memory transistor, said voltage application time of said at least one dummy memory transistor being different from a voltage application time of one of the first diffusion layer and the second diffusion layer of said memory transistor.

6. The nonvolatile semiconductor system of claim 1, wherein the change rate of threshold voltage of the at least one dummy memory transistor is set by an initial threshold voltage of said at least one dummy memory transistor, said initial threshold voltage of said at least one dummy memory transistors being different from an initial threshold voltage of said memory transistor.

7. The nonvolatile semiconductor system of claim 1, wherein the change rate of threshold voltage of the at least one dummy memory transistor is set by a capacitance of the floating gate electrode of the at least one dummy memory transistor and the control gate electrode of said at least one dummy memory transistor, said capacitance of the at least one dummy memory transistor being different from a capacitance of the floating gate electrode and the control gate electrode of the memory transistor.

8. The nonvolatile semiconductor system of claim 1, wherein said means for detecting the threshold voltage of said at least one dummy memory transistor detects the threshold voltage by applying a voltage to one of the first diffusion layer and the second diffusion layer of said at least one dummy memory transistor.

9. The nonvolatile semiconductor system of claim 1, wherein said means for detecting the threshold voltage of said at least one dummy memory transistor detects said threshold voltage by detecting a voltage at one of said first diffusion layer and said second diffusion layer of said at least one dummy memory transistor.

10. The nonvolatile semiconductor system of claim 1, wherein said means for detecting the threshold voltage of said at least dummy memory transistor detects said threshold voltage by detecting an electric current flowing between said first diffusion layer and said second diffusion layer of said at least one dummy memory transistor.

11. A nonvolatile semiconductor system comprising:
    a memory transistor comprising a floating gate electrode, a control gate electrode and first and second diffusion layers, said memory transistor storing data by injecting electrons into said floating gate electrode and releasing electrons from said floating gate electrode;
    at least one dummy memory transistor comprising a floating gate electrode, a control gate electrode and first and second diffusion layers, a change rate of threshold voltage of said at least one dummy memory transistor being different from a change range of threshold voltage of said memory transistor;

means for injecting the electrons into said at least one dummy memory transistor and for releasing said electrons from said at least one dummy memory transistor; and means for detecting a threshold voltage of said at least one dummy memory transistor in a verifying operation for monitoring the threshold voltage after the electrons have been released from said floating gate electrode of the memory transistor and the at least one dummy memory transistor.

12. The nonvolatile semiconductor system of claim 11, wherein said at least one dummy memory transistor comprises a first dummy memory transistor and a second dummy memory transistor, a change rate of threshold voltage of said first dummy memory transistor being greater than the change rate of threshold voltage of said memory transistor, a change rate of threshold voltage of said second dummy memory transistor being less than the change rate of threshold voltage of said memory transistor, whereby the threshold voltage of said memory transistor is set within a proper range on said verifying operation.

13. The nonvolatile semiconductor system of claim 12, wherein the change rate of threshold voltage of at least one of said first and second dummy memory transistors is set by applying a voltage to one of the first diffusion layer and the second diffusion layer of said at least one of said first and second dummy memory transistors, said voltage applied to said at least one of said first and second dummy memory transistors being different from a voltage applied to one of the first diffusion layer and the second diffusion layer of said memory transistor.

14. The nonvolatile semiconductor system of claim 11, wherein the change rate of threshold voltage of said at least one dummy memory transistor is set by applying a voltage to one of the first diffusion layer and the second diffusion layer of said at least one dummy memory transistor, said voltage applied to said at least one dummy memory transistor being different from a voltage applied to one of the first diffusion layer and the second diffusion layer of said memory transistor.

15. The nonvolatile semiconductor system of claim 11, wherein the change rate of threshold voltage of the at least one dummy memory transistor is set by a voltage application time to one of the first diffusion layer and the second diffusion layer of said at least one dummy memory transistor, said voltage application time of said at least one dummy memory transistor being different from a voltage application time of one of the first diffusion layer and the second diffusion layer of said memory transistor.

16. The nonvolatile semiconductor system of claim 11, wherein the change rate of threshold voltage of the at least one dummy memory transistor is set by an initial threshold voltage of said at least one dummy memory transistor, said initial threshold voltage of said at least one dummy memory transistor being different from an initial threshold voltage of said memory transistor.

17. The nonvolatile semiconductor system of claim 11, wherein the change rate of threshold voltage of the at least one dummy memory transistor is set by a capacitance of the floating gate electrode and the control gate electrode of said at least one dummy memory transistor, said capacitance of the at least one dummy memory transistor being different from a capacitance of the floating gate electrode and the control gate electrode of the memory transistor.

18. The nonvolatile semiconductor system of claim 11, wherein said means for detecting the threshold voltage of said at least one dummy memory transistor detects the threshold voltage by applying a voltage to one of the first diffusion layer and the second diffusion layer of said at least one dummy memory transistor.

19. The nonvolatile semiconductor system of claim 11, wherein said means for detecting the threshold voltage of said at least one dummy memory transistor detects said threshold voltage by detecting a voltage at one of said first diffusion layer and said second diffusion layer of said at least one dummy memory transistor.

20. The nonvolatile semiconductor system of claim 11, wherein said means for detecting the threshold voltage of said at least one dummy memory transistor detects said threshold voltage by detecting an electric current flowing between said first diffusion layer and said second diffusion layer of said at least one dummy memory transistor.

21. The nonvolatile semiconductor of claim 1, further comprising means for controlling the release of electrons from the memory transistor based on the detected threshold voltage of the at least one dummy memory transistor.

22. A nonvolatile semiconductor system comprising:

a memory transistor comprising a floating gate electrode, a control gate electrode and first and second diffusion layers, said memory transistor storing data by injecting electrons into said floating gate electrode and releasing electrons from said floating gate electrode;

at least one dummy memory transistor comprising a floating gate electrode, a control gate electrode and first and second diffusion layers, a change rate of threshold voltage of said at least one dummy memory transistor being different from a change rate of threshold voltage of said memory transistor;

means for causing electrons to be injected into said at least one dummy memory transistor and for causing electrons to be released from said at least one dummy memory transistor; and means for detecting changes in the threshold voltage of said at least one dummy memory transistor when the threshold voltage of said memory transistor and said at least one dummy memory transistor are changing.

* * * * *